(12) United States Patent
Zou et al.

(10) Patent No.: US 11,538,394 B2
(45) Date of Patent: Dec. 27, 2022

(54) GATE DRIVER CIRCUIT, DISPLAY DEVICE AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Yifeng Zou, Beijing (CN); Hui Wang, Beijing (CN); Rongcheng Liu, Beijing (CN); Xiong Xiong, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 507 days.

(21) Appl. No.: 16/491,799

(22) PCT Filed: Nov. 6, 2018

(86) PCT No.: PCT/CN2018/114192
§ 371 (c)(1),
(2) Date: Sep. 6, 2019

(87) PCT Pub. No.: WO2019/184358
PCT Pub. Date: Oct. 3, 2019

(65) Prior Publication Data
US 2021/0366352 A1 Nov. 25, 2021

(30) Foreign Application Priority Data
Mar. 30, 2018 (CN) .......................... 201810292777.8

(51) Int. Cl.
*G09G 3/3266* (2016.01)
*G09G 3/20* (2006.01)
*G11C 19/28* (2006.01)

(52) U.S. Cl.
CPC ... *G09G 3/2092* (2013.01); *G09G 2300/0426* (2013.01); *G09G 2310/0278* (2013.01);
(Continued)

(58) Field of Classification Search
CPC ......... G09G 3/2092; G09G 2300/0426; G09G 2310/0278; G09G 2310/0286;
(Continued)

(56) References Cited

U.S. PATENT DOCUMENTS 8,416,006 B1 * 4/2013 Timonen ............... G09G 3/3677
327/108
2002/0000961 A1 * 1/2002 Kang .................. G02F 1/13452
345/87
(Continued)

FOREIGN PATENT DOCUMENTS

CN     1428759 A      7/2003
CN     101290409 A    10/2008
(Continued)

OTHER PUBLICATIONS

Feb. 2, 20207—(CN) First Office Action Appn 201810292777.8 with English Translation.
(Continued)

*Primary Examiner* — Jose R Soto Lopez
(74) *Attorney, Agent, or Firm* — Banner & Witcoff, Ltd.

(57) ABSTRACT

A gate driver circuit, a display device and a driving method. The gate driver circuit includes: a scan signal generation circuit, wherein the scan signal generation circuit includes N1 stages of first output terminals, and the scan signal generation circuit is configured to output N1 first pulse scan signals stage by stage respectively through the N1 stages of first output terminals; and N2 level conversion circuits, wherein the N2 level conversion circuits are configured to output under a control of a plurality of conversion control
(Continued)

signals N1 second pulse scan signals which are in one-to-one correspondence with the N1 first pulse scan signals, and the plurality of conversion control signals include a plurality of first sub-control signals which are the N1 first pulse scan signals, wherein N1 is an integer greater than or equal to 2, and N2 is an integer greater than or equal to 2.

9 Claims, 17 Drawing Sheets

(52) U.S. Cl.
CPC ............... *G09G 2310/0286* (2013.01); *G09G 2310/0294* (2013.01); *G09G 2310/061* (2013.01); *G09G 2310/08* (2013.01); *G11C 19/28* (2013.01)

(58) Field of Classification Search
CPC ..... G09G 2310/0294; G09G 2310/061; G09G 2310/08; G09G 2230/00; G09G 2300/0408; G09G 2310/0289; G09G 3/3677; G11C 19/28
See application file for complete search history.

(56) References Cited

U.S. PATENT DOCUMENTS

| | | | | |
|---|---|---|---|---|
| 2004/0246246 A1* | 12/2004 | Tobita | ................... | G09G 3/325 345/205 |
| 2005/0068278 A1* | 3/2005 | Ito | ..................... | G09G 3/3677 345/204 |
| 2007/0001982 A1* | 1/2007 | Ito | ..................... | G09G 3/2011 345/98 |
| 2007/0002188 A1* | 1/2007 | Kumagai | ............. | G09G 3/2011 348/751 |
| 2008/0007816 A1* | 1/2008 | Maeda | .................. | G09G 3/344 359/296 |
| 2008/0136756 A1* | 6/2008 | Yeo | ..................... | G09G 3/3677 345/87 |
| 2008/0259010 A1 | 10/2008 | Ma | | |
| 2009/0164859 A1* | 6/2009 | Liu | ..................... | G09G 3/3677 714/727 |
| 2009/0309820 A1* | 12/2009 | Chen | .................... | G09G 3/3677 326/82 |
| 2009/0322737 A1* | 12/2009 | Kim | .................... | G09G 3/3677 345/215 |
| 2010/0123708 A1* | 5/2010 | Jang | ................... | G09G 3/3648 345/87 |
| 2011/0157132 A1* | 6/2011 | Byun | ................... | G09G 3/3677 345/211 |
| 2011/0210955 A1* | 9/2011 | Chang | ................. | G09G 3/3677 345/212 |
| 2011/0273417 A1* | 11/2011 | Shin | ........................ | G09G 3/20 345/211 |
| 2011/0273430 A1* | 11/2011 | Chia | .................... | G09G 3/3648 345/212 |
| 2013/0127779 A1* | 5/2013 | Lillie | .................. | G06F 3/04166 345/173 |
| 2014/0085285 A1* | 3/2014 | Kim | ........................ | G11C 19/28 377/67 |
| 2014/0145924 A1 | 5/2014 | Liu | | |
| 2015/0091883 A1* | 4/2015 | Pyun | ................... | G09G 3/2074 345/204 |
| 2015/0187314 A1* | 7/2015 | Choi | ..................... | G09G 3/2092 345/99 |
| 2016/0034097 A1* | 2/2016 | Chae | .................... | G06F 3/0443 345/173 |
| 2016/0155409 A1* | 6/2016 | Jeoung | ................ | G09G 3/3696 345/214 |
| 2016/0189658 A1* | 6/2016 | Hao | ....................... | G11C 19/28 345/212 |
| 2016/0224175 A1* | 8/2016 | Moon | ................... | G06F 3/0412 |
| 2016/0265501 A1* | 9/2016 | Miyazawa | ............ | F02P 3/0552 |
| 2016/0365050 A1 | 12/2016 | Qing et al. | | |
| 2016/0370922 A1* | 12/2016 | Fan | ..................... | G06F 3/04166 |
| 2017/0115807 A1* | 4/2017 | Cho | ........................ | G06F 3/044 |
| 2017/0115808 A1* | 4/2017 | Cho | ....................... | G06F 3/04166 |
| 2017/0213499 A1* | 7/2017 | Kong | .................... | G11C 19/28 |
| 2017/0278451 A1* | 9/2017 | Peng | ................... | G09G 3/3677 |
| 2018/0182341 A1* | 6/2018 | Imajo | ....................... | G09G 3/20 |
| 2018/0337682 A1* | 11/2018 | Takasugi | ................ | H03K 21/18 |
| 2019/0035350 A1* | 1/2019 | Miyata | .............. | G02F 1/136286 |
| 2019/0180691 A1* | 6/2019 | Takasugi | ................ | G09G 3/3233 |

FOREIGN PATENT DOCUMENTS

| | | |
|---|---|---|
| CN | 102668348 A | 9/2012 |
| CN | 104795038 A | 7/2015 |
| CN | 110322847 A | 10/2019 |
| EP | 0019709 A1 | 12/1980 |
| EP | 0903722 A2 | 3/1999 |

OTHER PUBLICATIONS

Dec. 8, 2021—(EP) Extended European Search Report Appn 18907475.0.

* cited by examiner

US 11,538,394 B2

GATE DRIVER CIRCUIT, DISPLAY DEVICE AND DRIVING METHOD

CROSS-REFERENCE TO RELATED APPLICATION

The application is a U.S. National Phase Entry of International Application No. PCT/CN2018/114192 filed on Nov. 6, 2018, designating the United States of America and claiming priority to Chinese Patent Application No. 201810292777.8, filed on Mar. 30, 2018. The present application claims priority to and the benefit of the above-identified applications and the above-identified applications are incorporated by reference herein in their entirety.

TECHNICAL FIELD

The embodiments of the present disclosure relate to a gate driver circuit, a display device and a driving method.

BACKGROUND

In the field of display technology, for example, a pixel array of a liquid crystal display panel generally includes a plurality of rows of gate lines and a plurality of columns of data lines intersecting with the gate lines. The gate lines may be driven by a bonded integrated driver circuit. In recent years, with continuous improvements of a preparation process of an amorphous-silicon thin film transistor or an oxide thin film transistor, a gate line driver circuit may be directly integrated on a thin film transistor array substrate to form a GOA (gate driver on array) for driving the gate lines. For example, the GOA consisting of a plurality of cascaded shift register units may be used for providing a switching voltage signal for the plurality of rows of gate lines of the pixel array, thereby, for example, controlling the plural rows of gate lines to switch on in sequence, for performing progressive scanning. Meanwhile, a data signal is provided for the corresponding row of pixel units in the pixel array by the data line, so as to form a grayscale voltage required by each grayscale of a display image at each pixel unit, thereby displaying a frame image.

SUMMARY

At least one embodiment of the present disclosure provides a gate driver circuit, which includes:

a scan signal generation circuit, wherein the scan signal generation circuit comprises N1 stages of first output terminals, and the scan signal generation circuit is configured to output N1 first pulse scan signals stage by stage respectively through the N1 stages of first output terminals; and N2 level conversion circuits, wherein the N2 level conversion circuits are configured to output, under a control of a plurality of conversion control signals, N1 second pulse scan signals which are in one-to-one correspondence with the N1 first pulse scan signals, and the plurality of conversion control signals comprise a plurality of first sub-control signals which are the N1 first pulse scan signals, wherein N1 is an integer greater than or equal to 2, and N2 is an integer greater than or equal to 2.

For example, in the gate driver circuit according to an embodiment of the present disclosure, N1 is equal to N2, and the N2 level conversion circuits are arranged in one-to-one correspondence with the N1 stages of first output terminals, and the N2 level conversion circuits are configured to output the N1 second pulse scan signals respectively.

For example, in the gate driver circuit according to an embodiment of the present disclosure, N1 is greater than N2, and each of the level conversion circuits is arranged corresponding to at least one of the N1 stages of first output terminals, and each of the level conversion circuits is configured to output at least one of the N1 second pulse scan signals respectively.

For example, in the gate driver circuit according to an embodiment of the present disclosure, each of the level conversion circuits comprises a first control terminal, a second control terminal and a second output terminal, the plurality of conversion control signals further comprise a plurality of second sub-control signals, and each of the level conversion circuits is configured to output a corresponding second pulse scan signal of the N1 second pulse scan signals through the second output terminal under a control of a corresponding first pulse scan signal of the N1 first pulse scan signals received at the first control terminal and a corresponding second sub-control signal of the plural second sub-control signals received at the second control terminal.

For example, in the gate driver circuit according to an embodiment of the present disclosure, each of the level conversion circuits comprises a first conversion subcircuit and a second conversion subcircuit, the first conversion subcircuit is connected to the first control terminal, and the first conversion subcircuit is configured to be switched on to output a first voltage to the second output terminal in a case where the corresponding first pulse scan signal received at the first control terminal is at a first level, and the second conversion subcircuit is connected to the second control terminal, and the first conversion subcircuit is configured to be switched on to output a second voltage to the second output terminal under a control of the corresponding second sub-control signal received at the second control terminal, so as to obtain the corresponding second pulse scan signal.

For example, in the gate driver circuit according to an embodiment of the present disclosure, the first conversion subcircuit comprises a first transistor, a gate of the first transistor is configured to be connected with the first control terminal to receive the corresponding first pulse scan signal, a first electrode of the first transistor is configured to be connected with a first voltage terminal to receive the first voltage, and the second electrode of the first transistor is configured to be connected with the second output terminal, and the second conversion subcircuit comprises a second transistor, a gate of the second transistor is configured to be connected with the second control terminal to receive the corresponding second sub-control signal, a first electrode of the second transistor is configured to be connected with a second voltage terminal to receive the second voltage, and the second electrode of the second transistor is configured to be connected with the second output terminal.

For example, in the gate driver circuit according to an embodiment of the present disclosure, the N2 level conversion circuits comprise a level conversion circuit at an mth stage, the N1 stages of first output terminals comprise a first output terminal at the mth stage, the N1 first pulse scan signals comprise an mth first pulse scan signal, the first output terminal at the mth stage is configured to output the mth first pulse scan signal, and the plurality of second sub-control signals comprise an mth second sub-control signal corresponding to the level conversion circuit at the mth stage, a first control terminal of the level conversion circuit at the mth stage is electrically connected with the first output terminal at the mth stage to receive the mth first pulse scan signal, and a second control terminal of the level conversion circuit at the mth stage is electrically connected with the first output terminal at the mth stage to receive the mth first pulse scan signal as the mth second sub-control signal, wherein m is an integer and 1≤m≤N1.

For example, in the gate driver circuit according to an embodiment of the present disclosure, the N2 level conversion circuits comprise a level conversion circuit at an mth stage, the N1 stages of first output terminals comprise a first output terminal at the mth stage and a first output terminal at an (m+i)th stage, the N1 first pulse scan signals comprise an mth first pulse scan signal and an (m+i)th first pulse scan signal, the first output terminal at the mth stage is configured to output the mth first pulse scan signal, and the first output terminal at the (m+i)th stage is configured to output the first pulse scan signal at the (m+i)th stage, the plurality of second sub-control signals comprise an mth second sub-control signal corresponding to the level conversion circuit at the mth stage, a first control terminal of the level conversion circuit at the mth stage is electrically connected with the first output terminal at the mth stage to receive the mth first pulse scan signal, a second control terminal of the level conversion circuit at the mth stage is electrically connected with the first output terminal at the (m+i)th stage to receive the (m+i)th first pulse scan signal, as the mth second sub-control signal, and a pulse of the mth first pulse scan signal and a pulse of the (m+i)th first pulse scan signal are consecutive in time, wherein i is an integer greater than or equal to 1, and m is an integer and 1≤m≤N1.

For example, in the gate driver circuit according to an embodiment of the present disclosure, each of the level conversion circuits comprises a first control terminal and a second control terminal, and each of the level conversion circuits is configured to output a corresponding second pulse scan signal of the N1 second pulse scan signals through the second output terminal under a control of a corresponding first pulse scan signal of the N1 first pulse scan signals received at the first control terminal.

For example, in the gate driver circuit according to an embodiment of the present disclosure, each of the level conversion circuits comprises a first conversion subcircuit and a second conversion subcircuit, the first conversion subcircuit is connected to the first control terminal, and the first conversion subcircuit is configured to be switched on to output a first voltage to the second output terminal in a case where the corresponding first pulse scan signal received at the first control terminal is at a first level, and the second conversion subcircuit is connected to the first control terminal, and the second conversion subcircuit is configured to be switched on to output a second voltage to the second output terminal in a case where the corresponding first pulse scan signal received at the first control terminal is at a second level, so as to obtain the corresponding second pulse scan signal.

For example, in the gate driver circuit according to an embodiment of the present disclosure, the first conversion subcircuit comprises a first transistor, a gate of the first transistor is configured to be connected with the first control terminal to receive the corresponding first pulse scan signal, a first electrode of the first transistor is configured to be connected with a first voltage terminal to receive the first voltage, and a second electrode of the first transistor is configured to be connected with the second output terminal, and the second conversion subcircuit comprises a second transistor, a gate of the second transistor is configured to be connected with the first control terminal to receive the corresponding first pulse scan signal, a first electrode of the second transistor is configured to be connected with a second voltage terminal to receive the second voltage, and a second electrode of the second transistor is configured to be connected with the second output terminal, and a type of the first transistor is opposite to a type of the second transistor.

For example, in the gate driver circuit according to an embodiment of the present disclosure, the first conversion subcircuit comprises a first transistor, the second conversion subcircuit comprises a second transistor and a phase inverter, a gate of the first transistor is configured to be connected with the first control terminal to receive the corresponding first pulse scan signal, a first electrode of the first transistor is configured to be connected with a first voltage terminal to receive the first voltage, and a second electrode of the first transistor is configured to be connected with the second output terminal, a gate of the second transistor is configured to be connected with the phase inverter, a first electrode of the second transistor is configured to be connected with a second voltage terminal to receive the second voltage, and a second electrode of the second transistor is configured to be connected with the second output terminal, and the phase inverter is connected with the first control terminal and the gate of the second transistor, and the phase inverter is configured to perform phase inversion on a level of the corresponding first pulse scan signal received at the first control terminal and output the level of the corresponding first pulse scan signal subjected to the phase inversion to the gate of the second transistor, and a type of the first transistor is identical with a type of the second transistor.

For example, in the gate driver circuit according to an embodiment of the present disclosure, each of the level conversion circuits further comprises a voltage holding subcircuit, the voltage holding subcircuit is configured to control a voltage of the second output terminal at the first voltage in a case where the second output terminal outputs the first voltage, and to control the voltage of the second output terminal at the second voltage in a case where the second output terminal outputs the second voltage.

For example, in the gate driver circuit according to an embodiment of the present disclosure, the voltage holding subcircuit comprises a first storage capacitor, a first electrode of the first storage capacitor is configured to be connected with the second output terminal, and a second electrode of the first storage capacitor is configured to be connected with a third voltage terminal to receive a third voltage.

For example, in the gate driver circuit according to an embodiment of the present disclosure, the scan signal generation circuit comprises N1 cascaded shift register units which are in one-to-one correspondence with the N1 stages of first output terminals.

For example, in the gate driver circuit according to an embodiment of the present disclosure, each of the shift register units is a GOA shift register unit.

For example, in the gate driver circuit according to an embodiment of the present disclosure, a jth first pulse scan signal of the N1 first pulse scan signals corresponds to a jth second pulse scan signal of the N1 second pulse scan signals, and a pulse amplitude of the jth first pulse scan signal is different from a pulse amplitude of the jth second pulse scan signal, wherein j is an integer and $1 \leq j \leq N1$.

At least one embodiment of the present disclosure further provides a display device, comprising the gate driver circuit according to any one of the above-mentioned embodiments.

At least one embodiment of the present disclosure further provides a method of driving a gate driver circuit, which includes:

outputting a first voltage to the second output terminal under a control of the corresponding first pulse scan signal received by the first control terminal; and outputting a second voltage to the second output terminal under a control of the corresponding second sub-control signal received by the second control terminal, so as to obtain the corresponding second pulse scan signal.

At least one embodiment of the present disclosure further provides a method of driving a gate driver circuit, which includes:

outputting a first voltage to the second output terminal in a case where the corresponding first pulse scan signal received by the first control terminal is at a first level; and outputting a second voltage to the second output terminal in a case where the corresponding first pulse scan signal received by the first control terminal is at a second level, so as to obtain the corresponding second pulse scan signal.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1A:
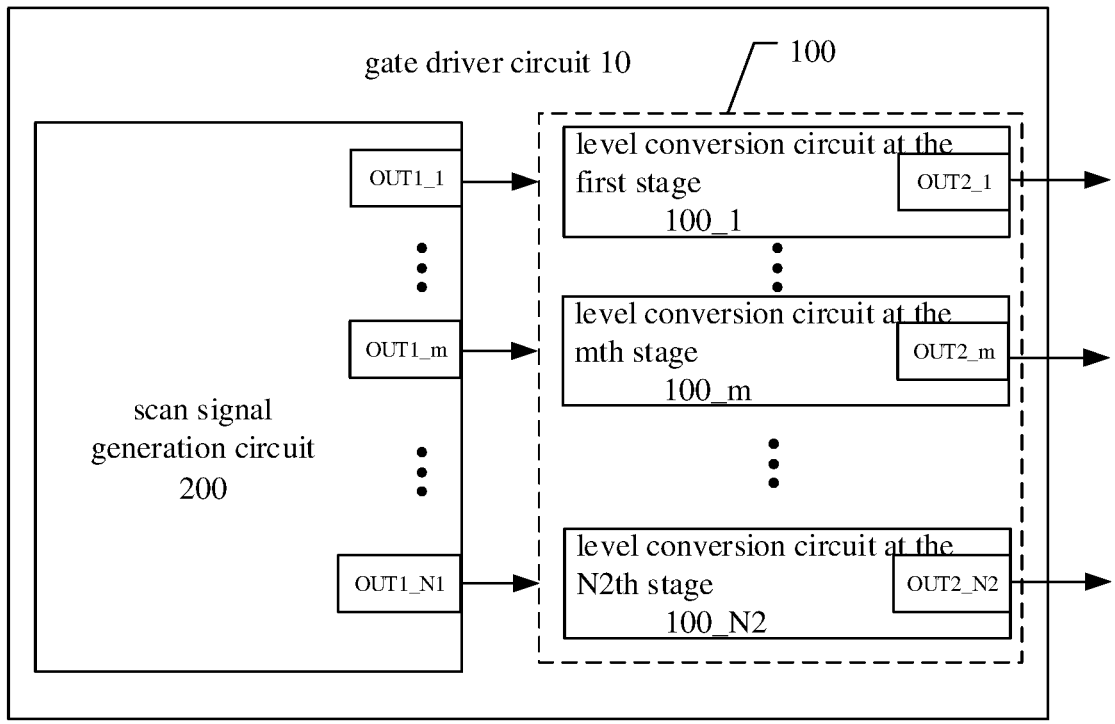
FIG. 1A is a schematic diagram of a gate driver circuit according to an embodiment of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be explained by several particular embodiments below. In order to keep the following description of the present disclosure clear and concise, detailed descriptions of known functions and components may be omitted. When any one of components of the embodiments of the present invention appears in more than one drawing, this component is denoted by the same reference numeral throughout the drawings.

In display panel technology, in order to realize low costs and a narrow bezel, the GOA technology may be adopted, that is, preparing the gate driver circuit on an array substrate of the display panel through a semiconductor preparation process, thereby achieving the advantages such as the narrow bezel, small thickness and low assembly costs.

In the existing GOA architecture, due to the limitation of the structure of the GOA, for example, some thin film transistors for controlling levels of a pull-up node and a pull-down node would be in a high-voltage state (for example, a dozen, even dozens of volts) for a long time, which causes a threshold voltage drift of the thin film transistor, thereby leading to the phenomenon of electricity leakage or inadequate turning-off of the thin film transistor, even multiple outputs of the GOA unit, and severely influencing the output accuracy of the GOA unit and the display quality of the display panel.

An embodiment of the present disclosure provides a gate driver circuit, including a scan signal generation circuit and N2 level conversion circuits. The scan signal generation circuit includes N1 stages of first output terminals, configured to output N1 first pulse scan signals respectively stage by stage; N2 level conversion circuits, configured to output N1 second pulse scan signals in one-to-one correspondence with the N1 first pulse scan signals under the control of a plurality of conversion control signals; the plurality of conversion control signals includes a plurality of first sub-control signals which are the N1 first pulse scan signals; wherein N1 is an integer greater than or equal to 2, and N2 is an integer greater than or equal to 2. The embodiments of the present disclosure further provide a display device and a driving method corresponding to the above-mentioned gate driver circuit.

The gate driver circuit, the display device and the driving method according to the embodiments of the present disclosure, on one hand, avoid a threshold drift caused by the long-term high-voltage bias state of some transistors in the scan signal generation circuit by reducing a working voltage of the transistor in the scan signal generation circuit to a logic voltage of a clock pulse signal, such as 3.3 V, thereby guaranteeing the stability of the transistor characteristics of the scan signal generation circuit, so as to prolong a service life of the transistor, improve the display quality of the display panel, and reduce power consumption; on the other hand, keep synchronous the phases of the signal before and after level conversion while guaranteeing the level conversion by the level conversion circuit taking an output signal generated by the scan signal generation circuit as a trigger signal, thereby meeting voltage requirements of the display panel.

The embodiments of the present disclosure and the examples thereof will be described below in detail in combination with the accompanying drawings.

Figure 1B:
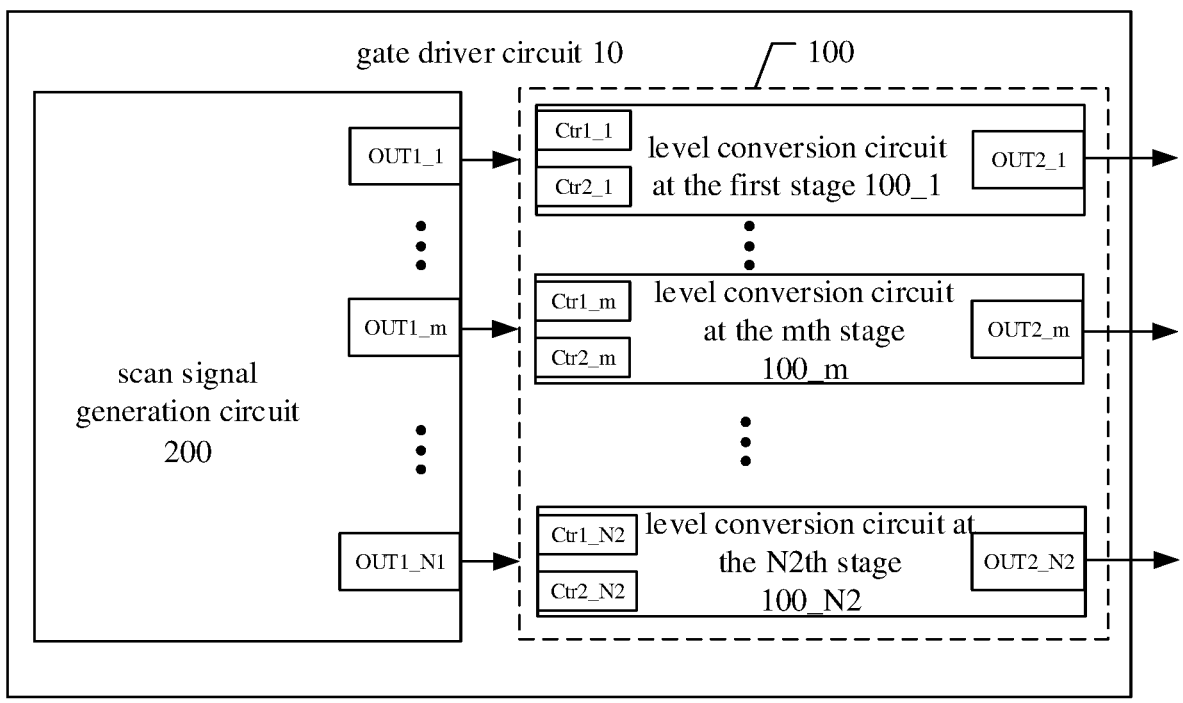
FIG. 1B is a schematic diagram of another gate driver circuit according to an embodiment of the present disclosure.
Figure 1C:
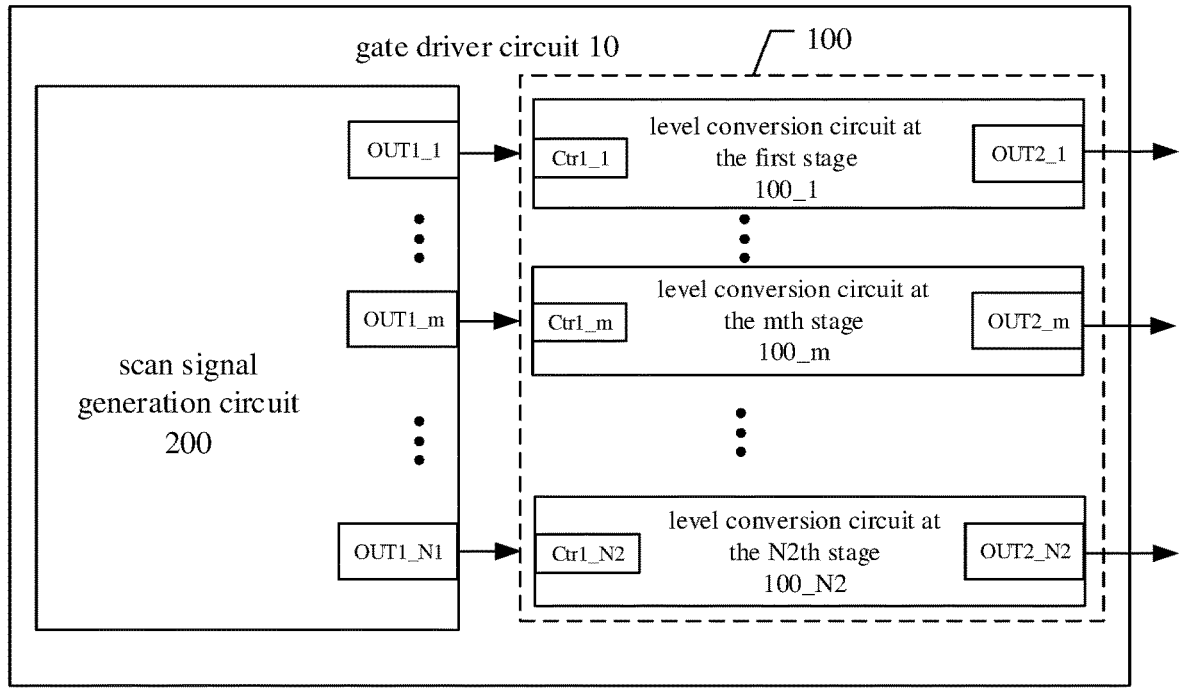
FIG. 1C is a schematic diagram of another gate driver circuit according to an embodiment of the present disclosure.

FIG. 1A is a schematic diagram of a gate driver circuit according to an embodiment of the present disclosure, FIG. 1B is a schematic diagram of another gate driver circuit according to an embodiment of the present disclosure, and FIG. 1C is a schematic diagram of another gate driver circuit according to an embodiment of the present disclosure.

For example, as shown in FIGS. 1A to 1C, this gate driver circuit 10 includes N2 level conversion circuits 100 (for example, in the embodiments as shown in FIG. 1B, N2 level conversion circuits 100 include a level conversion circuit 100_1 at the first stage, a level conversion circuit 100_m at the mth stage and a level conversion circuit 100_N2 at the N2th stage, etc., in the embodiment as shown in FIG. 1C, N2 level conversion circuits 100 include a level conversion circuit 100_1 at the first stage, a level conversion circuit 100_m at the mth stage and a level conversion circuit 100_N2 at the N2th stage (wherein m is an integer greater than or equal to 1 and less than or equal to N2) and a scan signal generation circuit 200, N2 is an integer greater than or equal to 2. For example, the scan signal generation circuit 200 may be a plurality of cascaded shift register units or an output port of an integrated driver chip, and the embodiments of the present disclosure have no limitation in this aspect.

For example, as shown in FIG. 1A, the scan signal generation circuit 200 includes N1 (N1 is an integer greater than or equal to 2) stages of first output terminals OUT1 (OUT1_1 to OUT1_N1), and is configured to output N1 first pulse scan signals stage by stage respectively through the N1 stages of first output terminals OUT1 according to a predetermined period. In one predetermined period, one first output terminal only outputs one first pulse scan signal corresponding to the first output terminal. For example, this predetermined period may be set as a scan period corresponding to progressive scanning, for example, including the time from the first output terminal at the first stage outputting a first pulse scan signal to the first output terminal at the N1th stage outputting the first pulse scan signal. This predetermined period may also be set as a scan period corresponding to interlaced scanning, for example, for odd-numbered stages, including the time from the first output terminal at the first stage outputting the first pulse scan signal to the first output terminal at the (N−1)th (N is an even number) stage or the Nth (N is an odd number) stage outputting the first pulse scan signal, and for even-numbered stages, including the time from the first output terminal at the second stage outputting the first pulse scan signal to the first output terminal at the Nth (N is an even number) stage or the (N−1)th (N is an odd number) stage outputting the first pulse scan signal.

For example, in an example, the scan signal generation circuit 200 includes N1 cascaded shift register units which are in one-to-one correspondence with N1 stages of first output terminals OUT1, i.e., one shift register unit corresponding to one first output terminal OUT1. For example, the shift register unit is a GOA shift register unit. In this example, the N2 level conversion circuits 100 and the scan signal generation circuit 200 are all prepared on the array substrate, thereby realizing the narrow bezel, small thickness and low assembly costs, etc. In another example, the scan signal generation circuit 200 is an integrated driver chip, which may be connected with the array substrate by, for example, a flexible printed circuit board (FPC) in a bonding manner. The scan signal generation circuit 200 may be further integrated into the integrated driver chip or prepared on the array substrate.

For example, as shown in FIG. 1A, the N1 first pulse scan signals are transmitted to the N2 level conversion circuits 100. The N2 level conversion circuits 100 are configured to output N1 second pulse scan signals in one-to-one correspondence with the N1 first pulse scan signals under the control of a plurality of conversion control signals, and the plurality of conversion control signals include a plurality of first sub-control signals which are N1 first pulse scan signals.

For example, as shown in FIGS. 1B and 1C, in some examples, N1 is equal to N2, and N2 level conversion circuits 100 are arranged in one-to-one correspondence with the N1 stages of first output terminals OUT1. N2 level conversion circuits 100 are configured to output N1 second pulse scan signals respectively. That is, one level conversion circuit is configured to output one second pulse scan signal corresponding to the level conversion circuit.

Figure 1D:
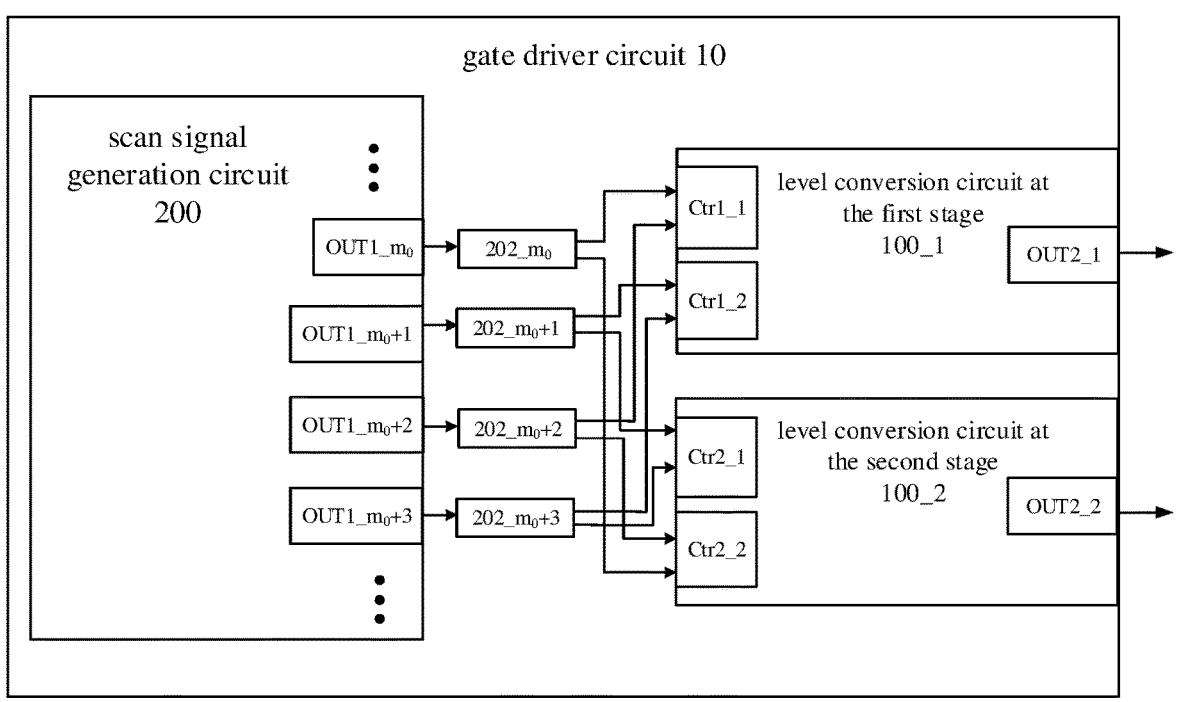
FIG. 1D is a schematic diagram of yet another gate driver circuit according to an embodiment of the present disclosure.

FIG. 1D is a local schematic diagram of a gate driver circuit according to an embodiment of the present disclosure.

For example, in some other embodiments, N1 is not equal to N2 and N1 is greater than N2. Each level conversion circuit is arranged corresponding to at least one first output terminal of the N1 stages of first output terminals OUT1, and each level conversion circuit is configured to output at least one second pulse scan signal of the N1 second pulse scan signals respectively. For example, the level conversion circuits 100 each correspond to plural stages of first output terminals OUT1. As shown in FIG. 1D, in some examples, N2 is 2, i.e., the gate driver circuit includes a level conversion circuit 100_1 at the first stage and a level conversion circuit 100_2 at the second stage. The first output terminal at each stage is connected with the level conversion circuit 100_1 at the first stage and the level conversion circuit 100_2 at the second stage by a switch element. For example, a first output terminal OUT1_$m_0$ at the moth stage is connected with the first control terminal Ctr1_1 of the level conversion circuit 100_1 at the first stage and the second control terminal Ctr2_2 of the level conversion circuit 100_2 at the second stage through the moth switch element 202_$m_0$. The first output terminal OUT1_$m_0$+1 at the ($m_0$+1)th stage is connected with the second control terminal Ctr1_2 of the level conversion circuit 100_1 at the first stage and the first control terminal Ctr2_1 of the level conversion circuit 100_2 at the second stage through the ($m_0$+1)th switch element 202_$m_0$30 1 respectively. The first output terminal OUT1_$m_0$+2 at the ($m_0$+2) stage is connected with the first control terminal Ctr1_1 of the level conversion circuit 100_1 at the first stage and the second control terminal Ctr2_2 of the level conversion circuit 100_2 at the second stage through the ($m_0$+2)th switch element 202_$m_0$+2 respectively. The first output terminal OUT1_$m_0$+3 at the ($m_0$+3)th stage is connected with the second control terminal Ctr1_2 of the level conversion circuit 100_1 at the first stage and the first control terminal Ctr2_1 of the level conversion circuit 100_2 at the second stage through the ($m_0$+3)th switch element 202_$m_0$+3 respectively, wherein $m_0$ is an integer greater than or equal to 1 and less than or equal to (N1−3).

For example, when the first output terminal OUT1_$m_0$ at the moth stage outputs the first pulse scan signal and the first output terminal OUT1_$m_0$+1 at the ($m_0$+1)th stage outputs the first pulse scan signal, the moth switch element 202_$m_0$ and the ($m_0$+1)th switch element 202_$m_0$+1 are turned on, and the ($m_0$+2)th switch element 202_$m_0$+2 and the ($m_0$+ 3)th switch element 202_$m_0$+3 are turned off, and thus when a first output terminal OUT1_$m_0$ at the moth stage outputs the first pulse scan signal, the level conversion circuits 100_1 at the first stage outputs the second pulse scan signal corresponding to the first pulse scan signal output by the first output terminal OUT1_$m_0$ at the moth stage; when the first output terminal OUT1_$m_0$+1 at the ($m_0$+1)th stage outputs the first pulse scan signal, the level conversion circuit 100_2 at the second stage outputs the second pulse scan signal corresponding to the first pulse scan signal output by the first output terminal OUT1_$m_0$+1 at the ($m_0$+1)th stage.

When the first output terminal OUT1_$m_0$+2 at the ($m_0$+ 2)th stage outputs the first pulse scan signal and the first output terminal OUT1_$m_0$+3 at the ($m_0$+3)th stage outputs the first pulse scan signal, the ($m_0$+2)th switch element 202_$m_0$+2 and the ($m_0$+3)th switch element 202_$m_0$+3 are turned on, and the moth switch element 202_$m_0$ and the ($m_0$+1)th switch element 202_$m_0$+1 are turned off, and thus when the first output terminal OUT1_$m_0$+2 at the ($m_0$+2) stage outputs the first pulse scan signal, the level conversion circuit 100_1 at the first stage outputs the second pulse scan signal corresponding to the first pulse scan signal output by the first output terminal OUT1_$m_0$+2 at the ($m_0$+2) stage; when the first output terminal OUT1_$m_0$+3 at the ($m_0$+3)th stage outputs the first pulse scan signal, the level conversion circuit 100_2 at the second stage outputs the second pulse scan signal corresponding to the first pulse scan signal output by the first output terminal OUT1_$m_0$+3 at the ($m_0$+3)th stage.

It should be noted that in the embodiment shown in FIG. 1D, the first pulse scan signal output by the first output terminal OUT1_$m_0$ at the moth stage, the first pulse scan signal output by the first output terminal OUT1_$m_0$+1 at the ($m_0$+1)th stage, the first pulse scan signal output by the first output terminal OUT1_$m_0$+2 at the ($m_0$+2) stage, and the first pulse scan signal output by the first output terminal OUT1_$m_0$+3 at the ($m_0$+3)th stage do not overlap in time. That is, at a certain time point, only one of the first output terminal OUT1_$m_0$ at the moth stage, the first output terminal OUT1_$m_0$+1 at the ($m_0$+1)th stage, the first output terminal OUT1_$m_0$+2 at the ($m_0$+2) stage and the first output terminal OUT1_$m_0$+3 at the ($m_0$+3)th stage outputs the corresponding first pulse scan signal. For example, when the first output terminal OUT1_$m_0$ at the moth stage outputs the first pulse scan signal, none of the first output terminal OUT1_$m_0$+1 at the ($m_0$+1)th stage, the first output terminal OUT1_$m_0$+2 at the ($m_0$+2) stage and the first output terminal OUT1_$m_0$+3 at the ($m_0$+3)th stage outputs a signal.

In the following, the gate driver circuit according to the embodiments of the present disclosure will be described in detail by taking N1 equal to N2 as an example.

For example, in some embodiments, each level conversion circuit 100 includes a corresponding first control terminal Ctr1 (for example, Ctr1_1, Ctr1_$m$ and Ctr1_N2 in FIG. 1B), a corresponding second control terminal Ctrl2 (for example, Ctr2_1, Ctr2_$m$ and Ctr2_N2 in FIG. 1B) and a corresponding second output terminal OUT2 (for example, OUT2_1, OUT2_$m$ and OUT2_N2 in FIGS. 1A and 1B). The plurality of conversion control signals further include a plurality of second sub-control signals. Each level conversion circuit is configured to output a corresponding second pulse scan signal of the N1 second pulse scan signals through the second output terminal under the control of the corresponding first pulse scan signal of the N1 first pulse scan signals received at the first control terminal and the corresponding second sub-control signal of the plurality of second sub-control signals received at the second control terminal. As shown in FIG. 1B, N2 level conversion circuits 100 include the level conversion circuit 100_$m$ at the mth stage. The working principle and structure of the level conversion circuit will be described by taking the level conversion circuit 100_m at the mth stage as an example. However, it should be understood that the following description about the level conversion circuit 100_m at the mth stage applies to any one level conversion circuit in N2 level conversion circuits without conflicts.

For example, the level conversion circuit 100_m at the mth stage includes the first control terminal Ctr1_m, the second control terminal Ctr2_m and the second output terminal OUT2_m. The N1 stages of first output terminals include the level conversion circuit 100_m at the mth stage, the N1 first pulse scan signals include the mth first pulse scan signal, the first output terminal OUT1_m at the mth stage is configured to output the mth first pulse scan signal, N1 second pulse scan signals include the mth second pulse scan signal corresponding to the mth first pulse scan signal, and the plurality of conversion control signals further include a plurality of sub-control signals which include the mth second sub-control signal corresponding to the mth first pulse scan signal.

For example, in the level conversion circuit 100_m at the mth stage, the first control terminal Ctr1_m is electrically connected to the first output terminal 100_m at the mth stage to receive the mth first pulse scan signal, and the second control terminal Ctr2_m is configured to receive the mth second sub-control signal. The level conversion circuit 100_m at the mth stage is configured to output the mth second pulse scan signal through its second output terminal OUT2_m under the control of the mth first pulse scan signal and the mth second sub-control signal, wherein m is an integer greater than or equal to 1 and less than or equal to N1. The mth second pulse scan signal is configured to drive, for example, the gate line connected with the second output terminal OUT2_m. Since the first control terminal Ctr1_m of the level conversion circuit 100_m at the mth stage is electrically connected with the first output terminal OUT1_m at the mth stage of the scan signal generation circuit 200 to receive the mth first pulse scan signal. Therefore, when the scan signal generation circuit 200 outputs the N1 first pulse scan signals in a manner of progressive scanning, the N2 level conversion circuits 100 also output the N1 second pulse scan signals in a manner of progressive scanning; when the scan signal generation circuit 200 outputs the N1 first pulse scan signals in a manner of interlaced scanning, the N2 level conversion circuits 100 also output the N1 second pulse scan signals in a manner of interlaced scanning. For example, the mth second sub-control signal received by the second control terminal Ctr2_m of the level conversion circuit 100_m at the mth stage may be one of the N1 first pulse scan signals. It should be noted that the present disclosure is not limited thereto. The plurality of second sub-control signals may also be other control signals which may achieve the level conversion function, and the embodiments of the present disclosure have no limitation in this aspect, and the case is the same for the following embodiments and will not be repeated.

For example, in an example, the second control terminal Ctr2 of the level conversion circuit 100_m at the mth stage is electrically connected to the first output terminal OUT1_m at the mth stage of the scan signal generation circuit 200 to receive the mth first pulse scan signal as the mth second sub-control signal. That is, in each level conversion circuit, the second control terminal is electrically connected with the first control terminal at the same stage, and with the corresponding first output terminal in the scan signal generation circuit 200.

For example, in another example, the N1 stages of first output terminals include a first output terminal at the (m+i)th stage (not shown), the N1 first pulse scan signals include the (m+i)th first pulse scan signal, the first output terminal at the (m+i)th stage is configured to output the (m+i)th first pulse scan signal, and the second control terminal Ctr2_m of the level conversion circuit 100_m at the mth stage is electrically connected to the first output terminal at the (m+i)th (i is an integer greater than or equal to 1) stage of the scan signal generation circuit 200, thus the (m+i)th first pulse scan signal is output to the second control terminal Ctr2_m of the level conversion circuit 100_m at the mth stage as the mth second sub-control signal. For example, when the gate driver circuit includes two clock signal lines, i is 1 and the second control terminal Ctr2_m of the level conversion circuit 100_m at the mth stage is electrically connected to the first output terminal at the (m+1)th stage of the scan signal generation circuit 200; when the gate driver circuit includes four clock signal lines, i is 2 and the second control terminal Ctr2_m of the level conversion circuit 100_m at the mth stage is electrically connected to the first output terminal at the (m+2)th stage of the scan signal generation circuit 200. It should be noted that in other embodiments of the present disclosure, the gate driver circuit may include six, eight or more clock signal lines, the connection manner of these clock signal lines may be determined based on actual requirements, and is not limited in the embodiment of the present disclosure.

For example, a pulse of the mth first pulse scan signal output from the first output terminal OUT1_m at the mth stage and a pulse of the (m+i)th first pulse scan signal output from the first output terminal at the (m+i)th stage are consecutive in time. That is, in each level conversion circuit, the pulse of the first pulse scan signal received at the second control terminal and the pulse of the first pulse scan signal received at the first control terminal are consecutive in time. For example, when the pulse of the mth first pulse scan signal output from the first output terminal OUT1_m at the mth stage changes to a low level from a high level, the pulse of the (m+i)th first pulse scan signal output from the first output terminal at the (m+i) stage changes to a high level from a low level; or when the pulse of the mth first pulse scan signal output from the first output terminal OUT1_m at the mth stage changes to a high level from a low level, the pulse of the (m+i)th first pulse scan signal output from the first output terminal at the (m+i) stage changes to a low level from a high level; and the case is the same for the following embodiments, and will not be repeated.

For example, each first pulse scan signal output from the scan signal generation circuit 200 includes a first level and a second level which are consecutive in time; each second pulse scan signal output from the level conversion circuit includes a first voltage and a second voltage, and the level conversion circuit is configured to output the first voltage to the second output terminal OUT2 of the level conversion circuit 100 when the first pulse scan signal is at the first level, and to output the second voltage to the second output terminal OUT2 of the level conversion circuit 100 when the first pulse scan signal is at the second level. The first and second voltages are consecutive in time. That is, the level conversion circuit 100 outputs the first and second voltages of the second pulse scan signal alternatively in response to the first and second levels of the first pulse scan signal, and the same applies to the following embodiments without repetition.

The gate driver circuit, on one hand, avoids a threshold drift due to the long-term high-voltage bias state of some transistors in the scan signal generation circuit by reducing a working voltage of the transistor in the scan signal generation circuit to a logic voltage of a clock pulse signal, such as 3.3 V, thereby guaranteeing the stability of the transistor characteristics of the scan signal generation circuit, so as to prolong a service life of the transistor, improve the display quality of the display panel, and reduce power consumption; on the other hand, keeps synchronous the phases of the signal before and after level conversion while guaranteeing the level conversion by the level conversion circuit taking an output signal generated by the scan signal generation circuit as a trigger signal, thereby meeting voltage requirements of the display panel.

For example, each level conversion circuit includes a first conversion subcircuit and a second conversion subcircuit, wherein the first conversion subcircuit is connected to the first control terminal, and is configured to be switched on to output the first voltage to the second output terminal when the corresponding first pulse scan signal received at the first control terminal is at the first level; the second conversion subcircuit is connected to the second control terminal, and is configured to be switched on to output the second voltage to the second output terminal under the control of the corresponding second sub-control signal received at the second control terminal, thereby obtaining the corresponding second pulse scan signal.

In the following, the specific structure of the level conversion circuit will be described in detail by taking the level conversion circuit 100_m at the mth stage as an example. The other level conversion circuits in the gate driver circuit are similar to the level conversion circuit at the mth stage, and the same applies to the following embodiments, and is not repeated.

Figure 2A:
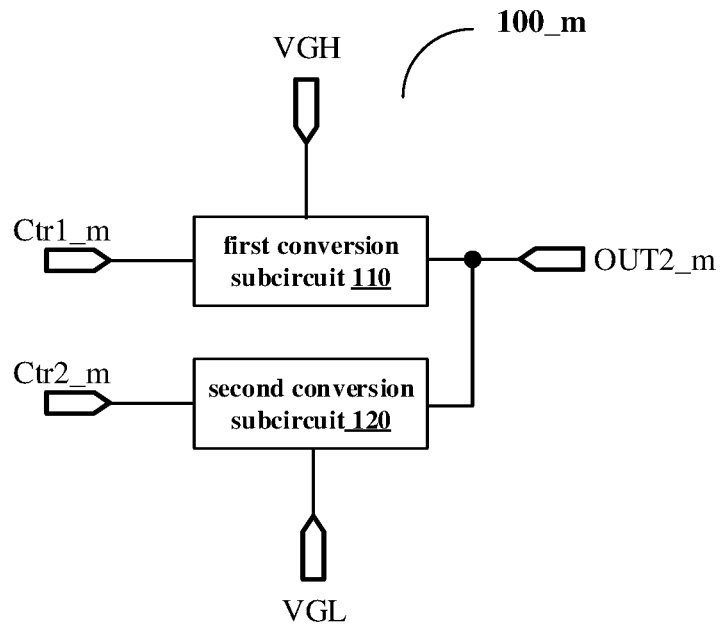
FIG. 2A is a schematic diagram of a level conversion circuit according to an embodiment of the present disclosure.

FIG. 2A is a schematic diagram of an exemplary level conversion circuit according to an embodiment of the present disclosure. For example, as shown in FIG. 2A, the level conversion circuit 100_m at the mth stage includes a first conversion subcircuit 110 and a second conversion subcircuit 120.

The first conversion subcircuit 110 is connected to the first control terminal Ctr1_m, and is configured to be switched on when the mth first pulse scan signal received at the first control terminal Ctr1_m is at the first level, so as to output the first voltage to the second output terminal OUT2_m of the level conversion circuit 100_m at the mth stage. For example, the first conversion subcircuit 110 may be connected with the first control terminal Ctr1_m, the first voltage terminal VGH and the second output terminal OUT2_m, and is configured to be switched on to connect the first voltage terminal VGH with the second output terminal OUT2_m when the mth first pulse scan signal received at the first control terminal Ctr1_m is at the first level, thereby outputting the first voltage to the second output terminal OUT2_m of the level conversion circuit 100_m, and converting the mth first pulse scan signal at the first level into the first voltage.

The second conversion subcircuit 120 is connected to the second control terminal Ctr2_m, and is configured to be switched on under the control of the mth second sub-control signal received at the second control terminal Ctr2_m, and to output the second voltage to the second output terminal OUT2_m of the level conversion circuit 100_m. The first voltage and the second voltage form the mth second pulse scan signal. For example, the second conversion subcircuit 120 may be connected with the second control terminal Ctr2_m, the second voltage terminal VGL and the second output terminal OUT2_m, and is configured to be switched on under the control of the mth second sub-control signal received at the second control terminal Ctr2_m, and to connect the second voltage terminal VGL with the second output terminal OUT2_m, thereby outputting the second voltage to the second output terminal OUT2_m of the level conversion circuit 100_m. For example, when the second conversion subcircuit 120 is switched on under the control of the mth second sub-control signal, the mth first pulse scan signal may be at the second level.

For example, in some embodiments, when the second control terminal Ctr2_m of the level conversion circuit 100_m at the mth stage is electrically connected to the first output terminal OUT1_m at the mth stage of the scan signal generation circuit 200, that is, electrically connected with the first control terminal Ctrl_m, the second conversion subcircuit 120 is configured to be switched on when the mth first pulse scan signal received at the second control terminal Ctr2_m is at the second level, and to output the second voltage to the second output terminal OUT2_m of the level conversion circuit 100_m. In some other embodiments, when the second control terminal Ctr2_m of the level conversion circuit 100_m at the mth stage is connected to the first output terminal at the (m+i)th stage of the scan signal generation circuit 200, the second conversion subcircuit 120 is configured to be switched on when the (m+i)th first pulse scan signal received at the second control terminal Ctr2_m is at the first level, and to output the second voltage to the second output terminal OUT2_m of the level conversion circuit 100_m.

For example, the jth first pulse scan signal of the N1 first pulse scan signals corresponds to the jth second pulse scan signal of the N1 second pulse scan signals. A pulse amplitude of the jth first pulse scan signal (that is, a voltage difference between the first level and the second level) is different from a pulse amplitude of the jth second pulse scan signal. The pulse amplitude of the jth first pulse scan signal is, for example, the pulse amplitude of the clock signal, for example, 3.3 V. The pulse amplitude of the jth second pulse scan signal is, for example, the pulse amplitude required by the scan signal of the display panel. j is an integer greater than or equal to 1 and less than or equal to N1. For example, the first level of the jth second pulse scan signal is the first voltage, the second level of the jth second pulse scan signal is the second voltage, and the difference value (that is the pulse amplitude) between the first voltage and the second voltage is, for example, a dozen of or dozens of volts. It should be noted that the sizes of the pulse amplitudes of the second and first pulse scan signals are determined based on actual requirements, and are not limited in the embodiments of the present disclosure.

It should be noted that the first levels of the first and second pulse scan signals are high, the second level is for example low (referring to the example in FIG. 8), which may be determined based on actual requirements, and is not limited in the embodiments of the present disclosure. In the embodiments of the present disclosure, the description is made by taking the first levels of the first and second pulse scan signals being high as an example, and the same applies to the following embodiments and is not repeated.

It should be noted that the first voltage terminal VGH, for example, may be configured to be kept inputting a DC high-level signal. For example, the DC high-level signal is referred to as the first voltage, for example, a dozen of or dozens of volts. The second voltage terminal VGL, for example, may be configured to be kept inputting a DC low-level signal. For example, the DC low-level signal is referred to as the second voltage lower than the first voltage. The same applies to the following embodiments and is not repeated.

For example, each level conversion circuit includes a first conversion subcircuit and a second conversion subcircuit, wherein the first conversion subcircuit is connected to the first control terminal, and is configured to be switched on when the corresponding first pulse scan signal received at the first control terminal is at the first level, and to output the first voltage to the second output terminal; the second conversion subcircuit is connected to the first control terminal, and is configured to be switched on when the corresponding first pulse scan signal received at the first control terminal is at the second level, and to output the second voltage to the second output terminal, thereby obtaining the corresponding second pulse scan signal.

Figure 3A:
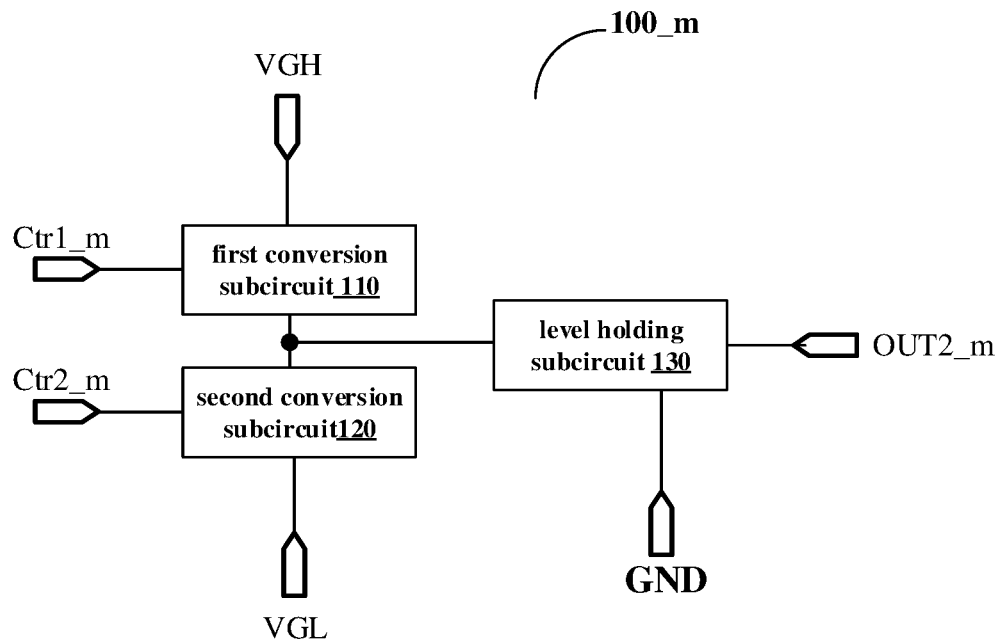
FIG. 3A is a schematic diagram of another level conversion circuit according to an embodiment of the present disclosure.

For example, as shown in FIG. 3A, on the basis of the example shown in FIG. 2A, the level conversion circuit 100_m at the mth stage further includes a level holding subcircuit 130. The voltage holding subcircuit 130 is configured to control the voltage of the second output terminal OUT2_m to be the first voltage in a case where the second output terminal OUT2_m outputs the first voltage, and to control the voltage of the second output terminal OUT2_m to be the second voltage in a case where the second output terminal OUT2_m outputs the second voltage.

As shown in FIG. 3A, the voltage holding subcircuit 130 is connected with the first conversion subcircuit 110, the second conversion subcircuit 120, the second output terminal OUT2_m and the third voltage terminal GND, and is configured to control the voltage at the second output terminal OUT2_m to be the first voltage in a case where the first conversion subcircuit 110 outputs the first voltage, and to control the voltage of the second output terminal OUT2_m to be the second voltage in a case where the second conversion subcircuit 120 outputs the second voltage. For example, the third voltage terminal is a grounded terminal, and the voltage input by the third voltage terminal is referred to as a third voltage. The third voltage may be selected based on actual requirements, for example, the third voltage is at a low level (lower than the first voltage), or grounded. The same applies to the following embodiments and is not repeated.

Figure 4A:
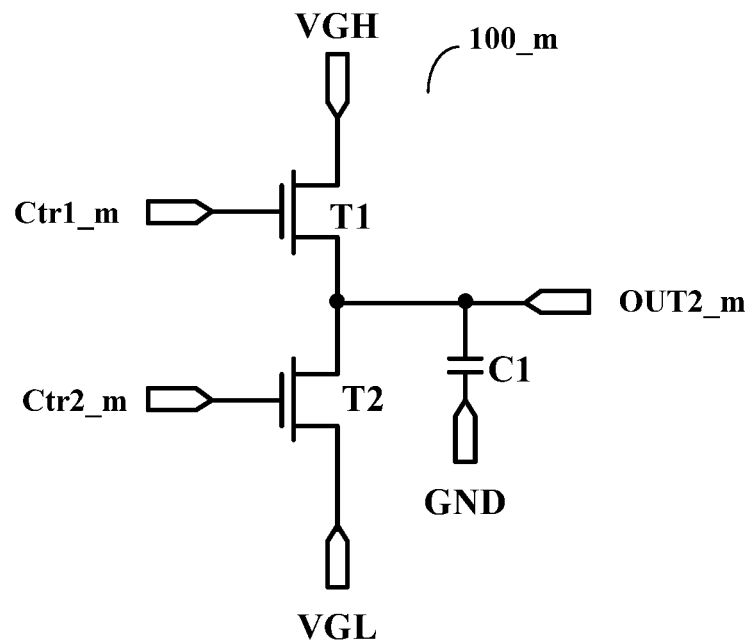
FIG. 4A is a schematic circuit diagram of a particular implementation example of the level conversion circuit shown in FIG. 3A.

For example, in an example, the level conversion circuit shown in FIG. 3A may be embodied as the circuit structure shown in FIG. 4A.

As shown in FIG. 4A, in this example, in more detail, the first conversion subcircuit 110 may be implemented as the first transistor T1. As shown in FIG. 4A, a gate of the first transistor T1 is configured to be connected with the first control terminal Ctr1_m to receive the corresponding first pulse scan signal, i.e., the mth first pulse scan signal which may control the first transistor T1 to be turned on or off. A first electrode of the first transistor T1 is configured to be connected with the first voltage terminal VGH to receive the first voltage, and the second electrode of the first transistor T1 is configured to be connected with the second output terminal OUT2_m.

As shown in FIG. 4A, the second conversion subcircuit 120 may be implemented as the second transistor T2. As shown in FIG. 4A, a gate of the second transistor T2 is configured to be connected with the second control terminal Ctr2_m to receive the corresponding first pulse scan signal, i.e., the mth second pulse scan signal which may control the second transistor T2 to be turned on or off. A first electrode of the second transistor T2 is configured to be connected with the second voltage terminal VGL to receive the second voltage, and the second electrode of the second transistor T2 is configured to be connected with the second output terminal OUT2_m and a second electrode of the first transistor T1.

As shown in FIG. 4A, the voltage holding subcircuit 130 may be implemented as a first storage capacitor C1. A first electrode of the first storage capacitor C1 is configured to be connected with the second output terminal OUT2_m and the second electrode of the first transistor T1 to control the level of the second output terminal OUT2_m at the first voltage, and with the second electrode of the second transistor T2 to control the level of the second output terminal OUT2_m at the second voltage, and the second electrode of the first storage capacitor C1 is configured to be connected with the third voltage terminal GND to receive the third voltage.

In the above-mentioned example, the first transistor T1 and the second transistor T2 will be described as N-type transistors, which is not limited in the embodiments of the present disclosure, and may be embodied as P-type transistors at least partially based on actual requirements.

For example, in some other embodiments, each level conversion circuit 100 includes a corresponding first control terminal (for example, Ctr1_1, Ctr1_m and Ctr1_N2 in FIG. 1B) and a corresponding second output terminal (for example, OUT2_1, OUT2_m and OUT2_N2 in FIG. 1C). Each level conversion circuit is configured to output the corresponding second pulse scan signal of the N1 second pulse scan signals through the second output terminal under the control of the corresponding first pulse scan signal of the N1 stages of first output terminals received at the first control terminal.

For example, as shown in FIG. 1C, the N2 level conversion circuits 100 include the level conversion circuit 100_m at the mth stage which includes the first control terminal Ctr1_m and the second output terminal OUT2_m. The N1 stages of first output terminals include the first output terminal OUT1_m at the mth stage, the N1 first pulse scan signals include the mth first pulse scan signal, the first output terminal OUT1_m at the mth stage is configured to output the mth first pulse scan signal, and the N1 second pulse scan signals include the mth second pulse scan signal corresponding to the mth first pulse scan signal.

For example, in the level conversion circuit 100_m at the mth stage, the first control terminal Ctr1_m is electrically connected to the first output terminal OUT1_m at the mth stage to receive the mth first pulse scan signal. The level conversion circuit 100_m at the mth stage is configured to output the mth second pulse scan signal by its second output terminal OUT2_m under the control of the mth first pulse scan signal, wherein m is an integer greater than or equal to 1 and less than or equal to N1.

Figure 2B:
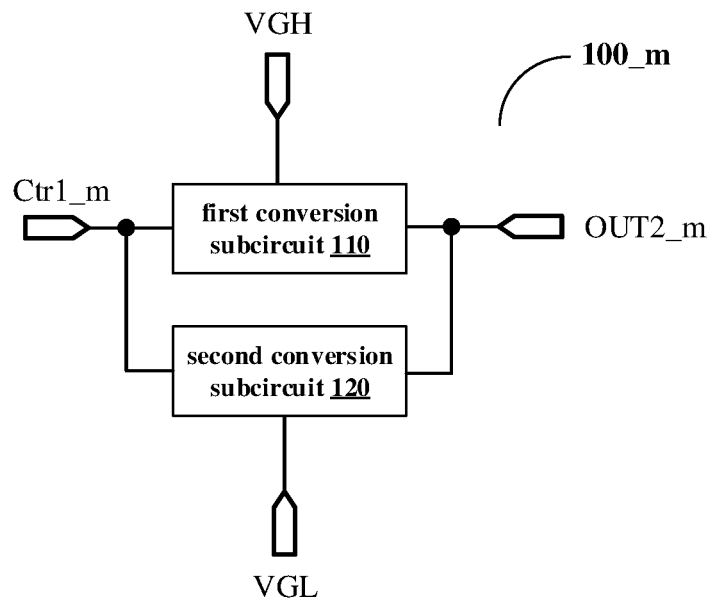
FIG. 2B is a schematic diagram of another level conversion circuit according to an embodiment of the present disclosure.

FIG. 2B is a schematic diagram of a level conversion circuit according to another example of the present disclosure. For example, as shown in FIG. 2B, the level conversion circuit 100_m at the mth stage in this example has a similar structure to the level conversion circuit 100_m at the mth stage shown in FIG. 2A expect that the level conversion circuit 100_m at the mth stage shown in FIG. 2B only includes one control terminal, i.e., the first control terminal Ctr1_m. It should be noted that in the level conversion circuit 100_m at the mth stage shown in FIG. 2A, the second control terminal Ctr2 may also be connected with the first control terminal Ctr1, i.e., the first and second conversion subcircuits 110 and 120 are both connected with the first control terminal, thus the first and second conversion subcircuits 110 and 120 are controlled by the same conversion control signal. It should be noted that the above-mentioned description about the level conversion circuit 100_m at the mth stage in FIG. 2A applies to the level conversion circuit 100_m at the mth stage in FIG. 2B on a non-conflicting basis.

For example, each level conversion circuit includes a first conversion subcircuit and a second conversion subcircuit, wherein the first conversion subcircuit is connected to the first control terminal, and is configured to be switched on to output the first voltage to the second output terminal in a case where the corresponding first pulse scan signal received at the first control terminal is at the first level; the second conversion subcircuit is connected to the first control terminal, and is configured to be switched on to output the second voltage to the second output terminal in a case where the corresponding first pulse scan signal received at the first control terminal is at the second level, thereby obtaining the corresponding second pulse scan signal.

For example, as shown in FIG. 2B, the level conversion circuit 100_m at the mth stage includes a first conversion subcircuit 110 and a second conversion subcircuit 120. The first conversion subcircuit 110 is connected to the first control terminal Ctr1_m, and is configured to be switched on to output the first voltage to the second output terminal OUT2_m of the level conversion circuit 100_m at the mth stage in a case where the mth first pulse scan signal received at the first control terminal Ctr1_m is at the first level. The second conversion subcircuit 120 is connected to the first control terminal Ctr1_m, and is configured to be switched on to output the second voltage to the second output terminal OUT2_m of the level conversion circuit 100_m at the mth stage in a case where the mth first pulse scan signal received at the first control terminal Ctr1_m is at the second level, thereby obtaining the mth second pulse scan signal.

For example, the second conversion subcircuit 120 may be connected with the first control terminal Ctr1_m, the second voltage terminal VGL and the second output terminal OUT2_m, and is configured to be switched on to connect the second voltage terminal VGL with the second output terminal OUT2_m in a case where the mth first pulse scan signal received at the first control terminal Ctr1_m is at the second level, thereby outputting the second voltage to the second output terminal OUT2_m of the level conversion circuit 100_m at the mth stage, converting the level of the mth first pulse scan signal into the second voltage from the first level, and obtaining the mth second pulse scan signal.

For example, the function of controlling the second conversion subcircuit 120 by the mth first pulse scan signal may be implemented by providing a phase inverter circuit between the first control terminal Ctr1_m and the second conversion subcircuit 120. For another example, the function of controlling the second conversion subcircuit 120 by the mth first pulse scan signal may be implemented by using different types of transistors in the first and second conversion subcircuits 110 and 120. For example, the N-type transistor is used in the first conversion subcircuit 110, and the P-type transistor is used in the second conversion subcircuit 120, and vice versa. It should be noted that the implementation of the second conversion subcircuit 120 may be determined based on actual requirements, and is not limited in the embodiments of the present disclosure.

Figure 3B:
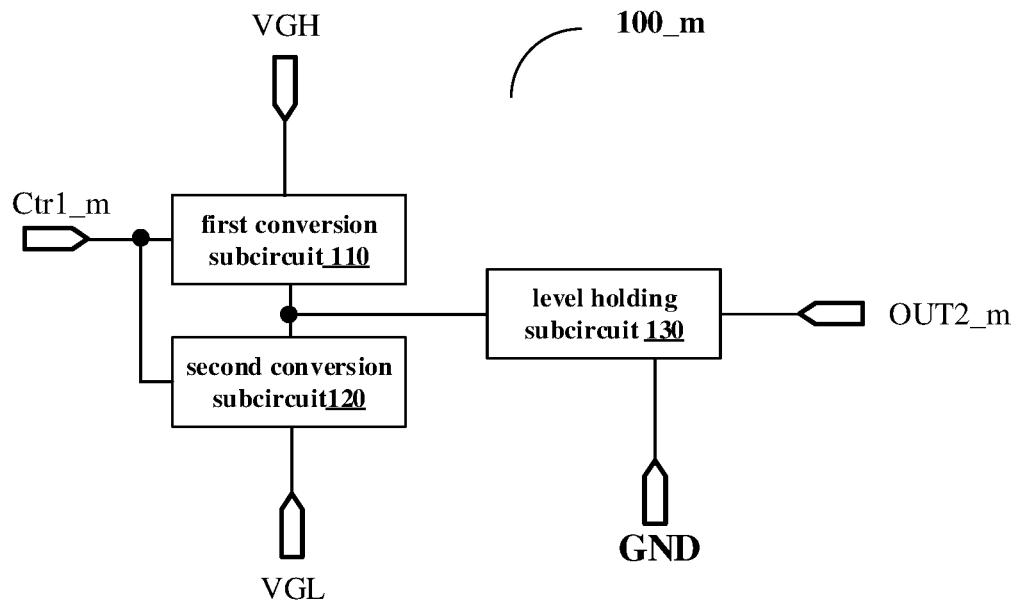
FIG. 3B is a schematic diagram of yet another level conversion circuit according to an embodiment of the present disclosure.

For example, as shown in FIG. 3B, on the basis of the example shown in FIG. 2B, the level conversion circuit 100_m at the mth stage further includes a level holding subcircuit 130. As shown in FIG. 3B, the level conversion circuit 100_m at the mth stage in this example has a similar structure to the level conversion circuit 100_m at the mth stage shown in FIG. 3A except that the level conversion circuit 100_m at the mth stage shown in FIG. 3B only includes one control terminal, i.e., the first control terminal Ctr1_m. The first and second conversion subcircuits 110 and 120 are both connected with the first control terminal Ctr1_m. The connection of the first and second conversion subcircuits 110 and 120 with the first control terminal Ctr1_m is similar to the connection shown in FIG. 2B, and is not repeated herein.

For example, the first and second conversion subcircuits 110 and 120 work alternatively in response to the first or second level of the mth first pulse scan signal received at the first control terminal Ctr1_m.

Figure 4B:
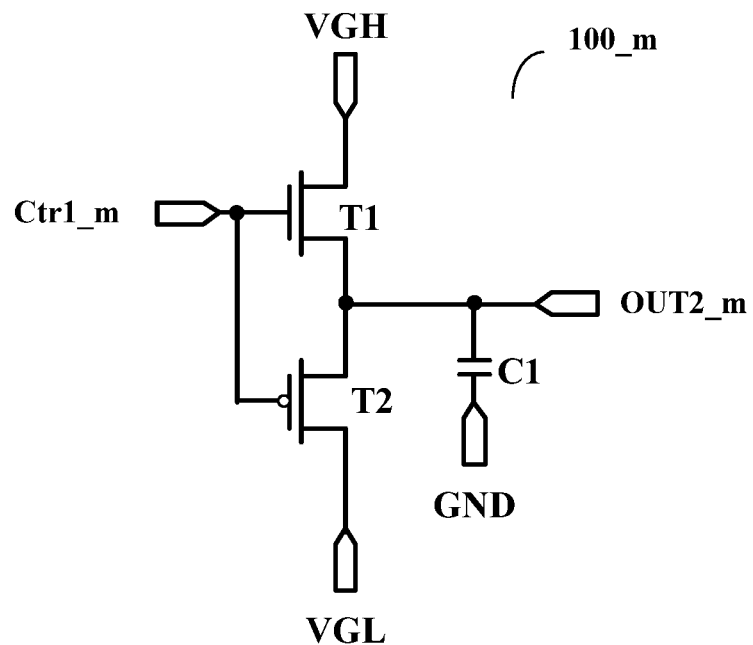
FIG. 4B is a schematic circuit diagram of a particular implementation example of the level conversion circuit shown in FIG. 3B.

For example, in an example, the level conversion circuit shown in FIG. 3B may be embodied as the circuit structure shown in FIG. 4B. In this example, the circuit structure of the level conversion circuit shown in FIG. 4B is similar to the circuit structure shown in FIG. 4A, with the difference in the implementation of the second conversion subcircuit 120.

As shown in FIG. 4B, the first conversion subcircuit 110 includes a first transistor T1, and a gate of the first transistor T1 is configured to be connected with the first control terminal Ctr1_m to receive the corresponding first pulse scan signal, i.e., the mth first pulse scan signal. A first electrode of the first transistor T1 is configured to be connected with the first voltage terminal VGH to receive the first voltage, and a second electrode of the first transistor T1 is configured to be connected with the second output terminal OUT2_m.

For example, as shown in FIG. 4B, the second conversion subcircuit 120 may be implemented as the second transistor T2. A gate of the second transistor T2 is configured to be connected with the first control terminal Ctr1_m to receive the corresponding first pulse scan signal, i.e., the mth first pulse scan signal, a first electrode of the second transistor T2 is configured to be connected with the second voltage terminal VGL, and a second electrode of the second transistor T2 is configured to be connected with the second output terminal OUT2_m and the second electrode of the first transistor T1, wherein the type of the first transistor T1 is opposite to that of the second transistor T2. For example, in the present embodiment, the first transistor T1 may be an N-type transistor, and the second transistor T2 may be a P-type transistor. For example, the first transistor T1 turns on when the first pulse scan signal is at the first level, so as to connect the first voltage terminal VGH with the second output terminal OUT2_m, thereby outputting the first voltage to the second output terminal OUT2_m. The second transistor T2 turns off when the first pulse scan signal is at the second level to connect the second voltage terminal VGL with the second output terminal OUT2_m, thereby outputting the second voltage to the second output terminal OUT2_m, guaranteeing the phase of the second pulse scan signal consistent with the phase of the first pulse scan signal while implementing level conversion, and meeting the voltage requirement of the display panel.

Figure 4C:
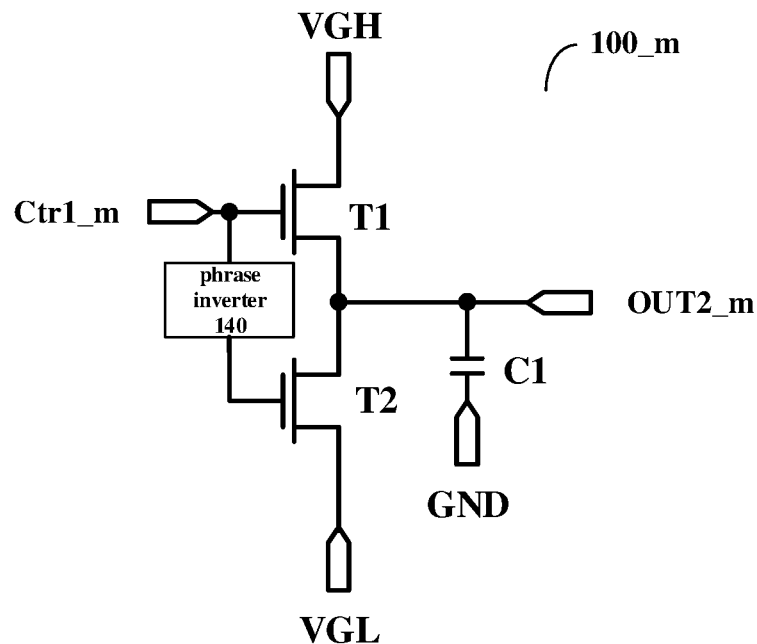
FIG. 4C is a schematic circuit diagram of another particular implementation example of the level conversion circuit shown in FIG. 3B.

For example, in another example, the level conversion circuit shown in FIG. 3B may also be embodied as the circuit structure shown in FIG. 4B. As shown in FIG. 4C, the level conversion circuit 100_m has a similar structure to the level conversion circuit 100_m shown in FIG. 4B expect that the second conversion subcircuit 120 may further include a phase inverter 140.

For example, as shown in FIG. 4C, the first conversion subcircuit 110 includes the first transistor T1, and the gate of the first transistor T1 is configured to be connected with the first control terminal Ctr1_m to receive the corresponding first pulse scan signal, i.e., the mth first pulse scan signal. The first electrode of the first transistor T1 is configured to be connected with the first voltage terminal VGH to receive the first voltage, and the second electrode of the first transistor T1 is configured to be connected with the second output terminal OUT2_m.

For example, as shown in FIG. 4C, the second conversion subcircuit 120 may be implemented as the second transistor T2 and a phase inverter 140. For example, the gate of the second transistor T2 is configured to be connected with the phase inverter 140, the first electrode of the second transistor T2 is configured to be connected with the second voltage terminal VGL to receive the second voltage, and the second electrode of the second transistor T2 is configured to be connected with the second output terminal OUT2_m and is connected with the second electrode of the first transistor T1. For example, the phase inverter 140 is connected with the first control terminal Ctrl_m and the gate of the second transistor T2, an input terminal of the phase inverter 140 is connected with the first control terminal Ctrl_m, and an output terminal of the phase inverter 140 is connected with the gate of the second transistor T2. The phase inverter 140 is configured to output the corresponding first pulse scan signal received at the first control terminal Ctrl_m, i.e., the level of the mth first pulse scan signal, subjected to phase inversion, to the gate of the second transistor T2, and in this example, the type of the first transistor T1 is the same as that of the second transistor T2, for example, an N type transistor. It should be noted that the phase inverter 140 may be any circuit structure which may implement the function of the phase inverter, and is not repeated herein.

Figure 5A:
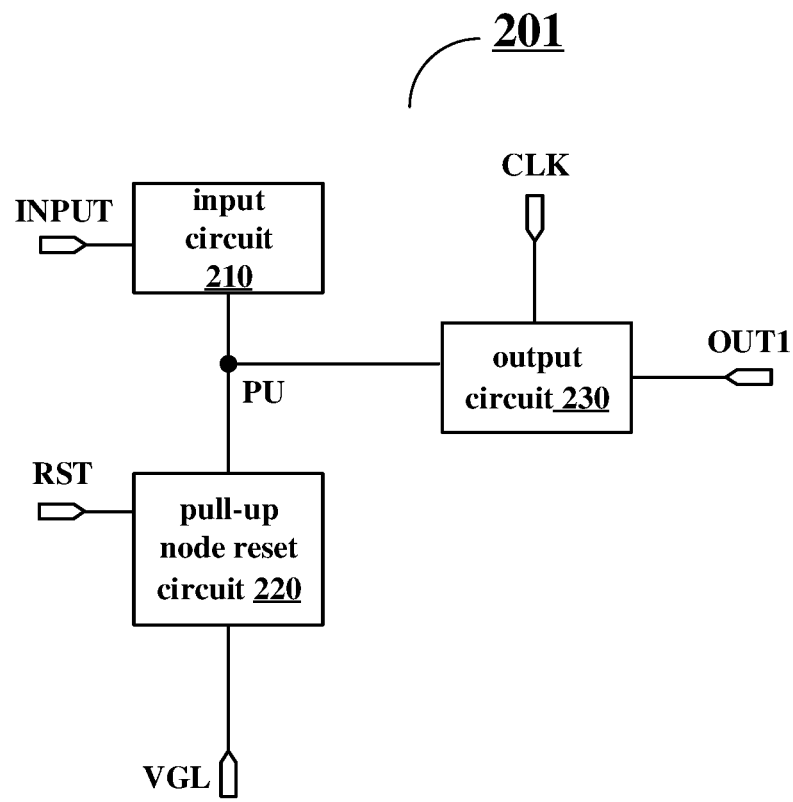
FIG. 5A is a schematic diagram of a shift register unit according to an embodiment of the present disclosure.

For example, in the embodiments of the present disclosure, the scan signal generation circuit 200 may include N cascaded shift register units 201. For example, the shift register unit 201 may be a GOA shift register unit. For example, FIG. 5A is a schematic diagram of a shift register unit 201 according to an embodiment of the present disclosure. As shown in FIG. 5A, the shift register unit 201 includes an input circuit 210, a pull-up node reset circuit 220 and an output circuit 230.

The input circuit 210 is configured to charge the pull-up node PU in response to an input signal. For example, the input circuit 210 may be connected with the input terminal INPUT and the pull-up node PU, is configured to electrically connect the pull-up node PU with the input terminal INPUT or an extra high-voltage terminal under the control of the signal input at the input terminal INPUT, thereby charging the pull-up node PU by the high-level signal input at the input terminal INPUT or the high-level signal output from the high-voltage level terminal, such that the voltage of the pull-up node PU is increased to control the output circuit 230 to be switched on.

The pull-up node reset circuit 220 is configured to charge the pull-up node PU in response to a reset signal. For example, the pull-up node reset circuit 220 may be configured to be connected with a reset terminal RST. Therefore, under the control of the reset signal input at the reset terminal RST, the pull-up node PU is electrically connected with the low-level signal or a low-voltage terminal which is for example a second voltage terminal VGL, thereby pull-down resetting the pull-up node PU.

The output circuit 230 is configured to output the first clock signal input at the first clock signal terminal CLKA to the first output terminal OUT1 under the control of the level of the pull-up node PU, as the output signal of the shift register unit 201 to be input to the level conversion circuit 100. For example, the output circuit 230 may be configured to be switched on under the control of the level of the pull-up node PU, so that the first clock signal terminal CLKA is electrically connected with the first output terminal OUT1, thereby outputting the clock signal input at the first clock signal terminal CLKA to the first output terminal OUT1.

Figure 5B:
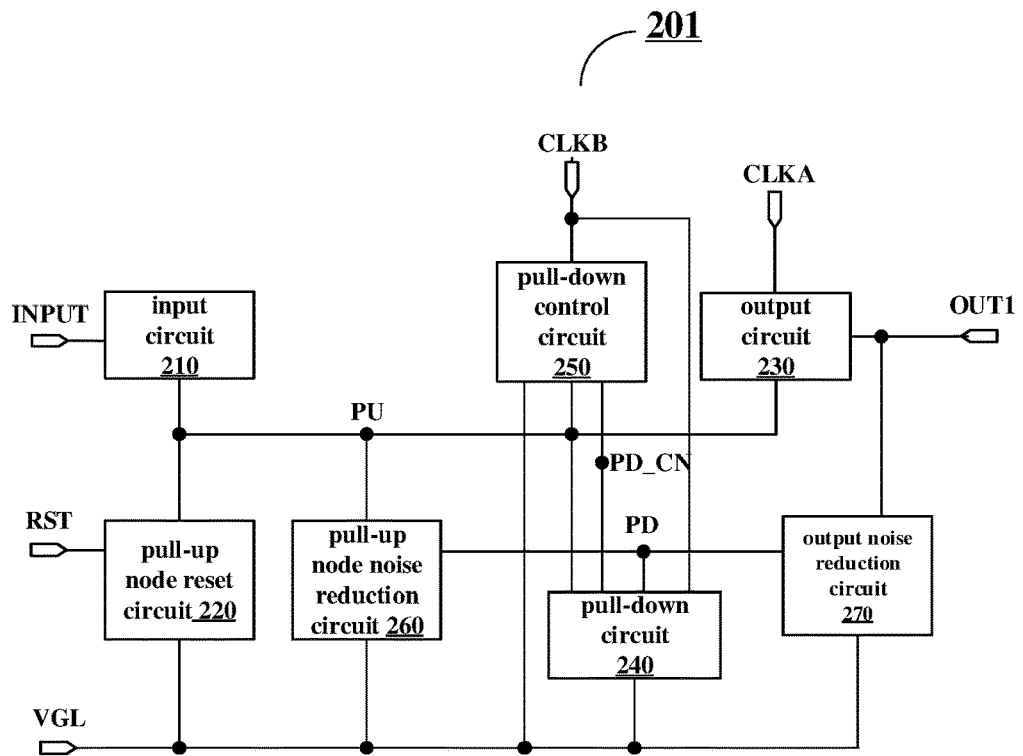
FIG. 5B is a schematic diagram of another shift register unit according to an embodiment of the present disclosure.

For example, as shown in FIG. 5B, in another example of the embodiments of the present disclosure, the shift register unit 201 may further include a pull-down circuit 240, a pull-down control circuit 250, a pull-up node noise reduction circuit 260 and an output noise reduction circuit 270.

The pull-down circuit 240 is configured to control the level of the pull-down node PD under the control of the levels of the pull-up node PU and the pull-down control node PD_CN, thereby controlling the level of the pull-down node PD, and further controlling the pull-up node noise reduction circuit 260 and the output noise reduction circuit 270.

For example, the pull-down circuit 240 may be connected with the second clock signal terminal CLKB, the second voltage terminal VGL, the pull-up node PU, the pull-down node PD and the pull-down control node PD_CN, so as to electrically connect the pull-down node PD with the second voltage terminal VGL under the control of the level of the pull-up node PU, thereby pull-down controlling the level of the pull-down node PD to make the pull-down node PD to be at the low level. Meanwhile, the pull-down circuit 240 may electrically connect the pull-down node PD with the second clock signal terminal CLKB under the control of the level of the pull-down control node PD_CN, thereby charging the pull-down node PD to make the pull-down node PD to be at the high level. For example, the threshold drift due to a long-term high-voltage state of the transistor in the circuit is avoided by reducing a working voltage of the pull-down circuit to a logic voltage of the second clock signal, for example, 3.3 V.

Figure 5C:
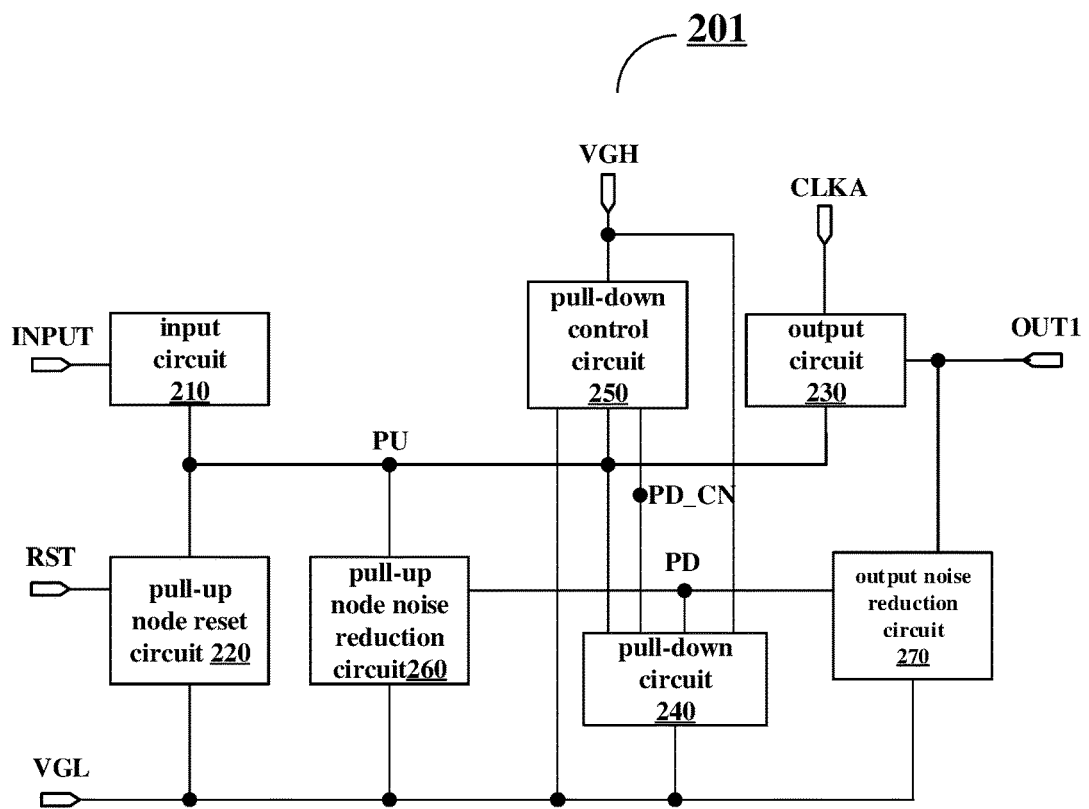
FIG. 5C is a schematic diagram of yet another shift register unit according to an embodiment of the present disclosure.

For example, as shown in FIG. 5C, in another example, the shift register unit may further adopt a DC (direct current) noise reduction structure. For example, the pull-down circuit 240 may be connected with the first voltage terminal VGH, the second voltage terminal VGL, the pull-up node PU, the pull-down node PD and the pull-down control node PD_CN, so as to electrically connect the pull-down node PD with the second voltage terminal VGL under the control of the level of the pull-up node PU, thereby pull-down controlling the level of the pull-down node PD to make the pull-down node PD to be at the low level. Meanwhile, the pull-down circuit 240 may electrically connect the pull-down node PD with the first voltage terminal VGH under the control of the level of the pull-down control node PD_CN, thereby charging the pull-down node PD to make the pull-down node PD to be at the high level.

The pull-down control circuit 250 is configured to control the level of the pull-down control node PD_CN under the control of the level of the pull-up node PU. For example, the pull-down control circuit 250 may be connected with the second clock signal terminal CLKB, the second voltage terminal VGL, the pull-up node PU and the pull-down control node PD_CN, so as to electrically connect the pull-down control node PD_CN with the second voltage terminal VGL under the control of the level of the pull-up node PU, thereby controlling the level of the pull-down control node PD_CN. For example, the threshold drift due to a long-term high-voltage state of the transistor in the circuit is avoided by reducing the working voltage of the pull-down circuit to a logic voltage of the second clock signal, for example, 3.3 V.

For example, as shown in FIG. 5C, in another example, the pull-down control circuit 250 may be connected with the first voltage terminal VGH, the second voltage terminal VGL, the pull-up node PU and the pull-down control node PD_CN, so as to electrically connect the pull-down control node PD_CN with the second voltage terminal VGL under the control of the level of the pull-up node PU, thereby controlling the level of the pull-down control node PD_CN.

The pull-up node noise reduction circuit 260 is configured to reduce noise at the pull-up node PU under the control of the level of the pull-down node PD. For example, the pull-up node noise reduction circuit 260 may be configured to be connected with the second voltage terminal VGL, so as to electrically connect the pull-up node PU with the second voltage terminal VGL under the control of the level of the pull-down node PD, thereby pulling down the pull-up node PU and reducing noise at the pull-up node PU.

The output noise reduction circuit 270 is configured to reduce noise at the first output terminal OUT1 under the control of the level of the pull-down node PD. For example, the output noise reduction circuit 270 may be configured to electrically connect the first output terminal OUT1 with the second voltage terminal VGL under the control of the level of the pull-down node PD, thereby pulling down the first output terminal OUT1 and reducing noise at the first output terminal OUT1.

It should be noted that the shift register unit is not limited to the structure shown in FIGS. 5A, 5B and 5C, may further be of other types, and is not limited in the embodiments of the present disclosure. For example, based on the example shown in FIG. 5C, the shift register unit may further include a pull-down circuit and a pull-down control circuit, with the connections similar to those of the pull-down circuit 240 and the pull-down control circuit 250 shown in FIG. 5C, which will not be repeated herein. The shift register unit works alternatively by means of two first voltage terminals to reduce a stress of the transistor connected with the first voltage terminal and prolong the service life.

Figure 6A:
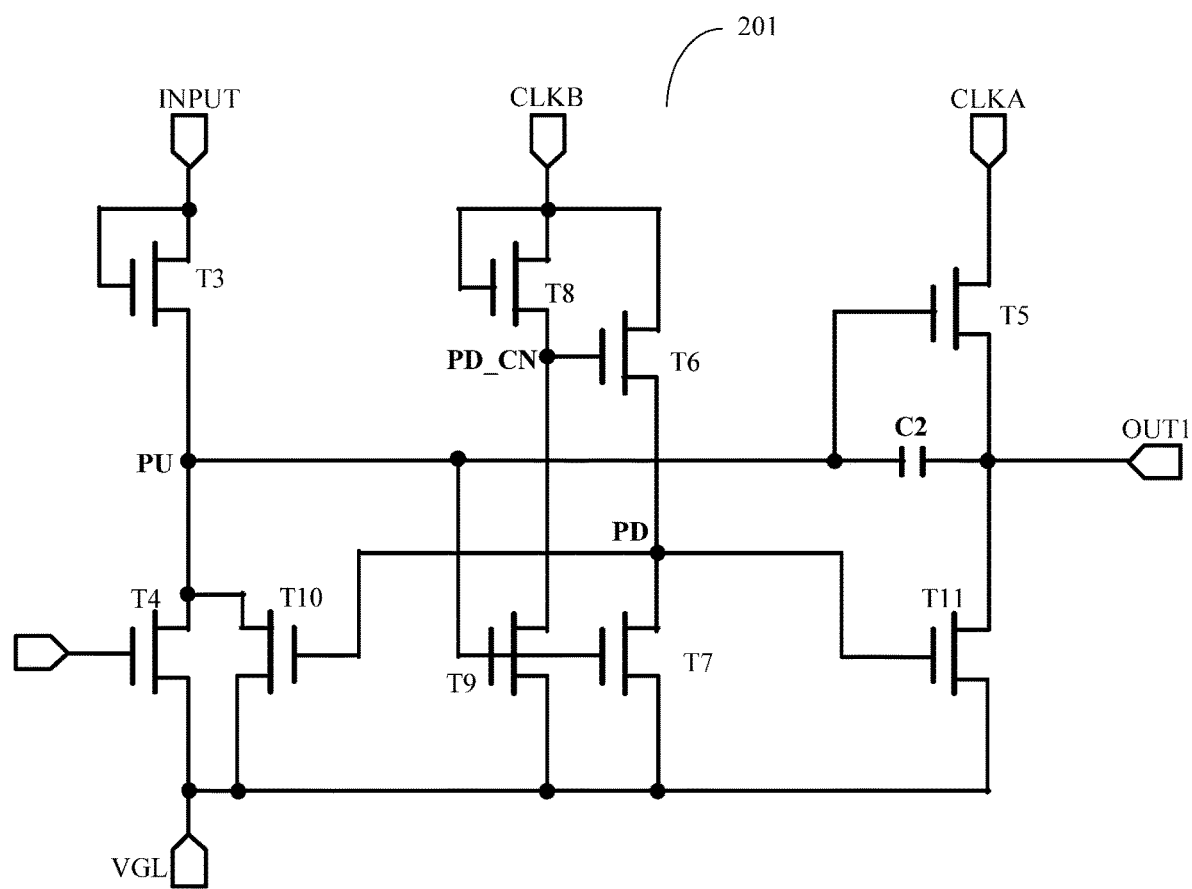
FIG. 6A is a schematic circuit diagram of the shift register unit shown in FIG. 5B.
Figure 6B:
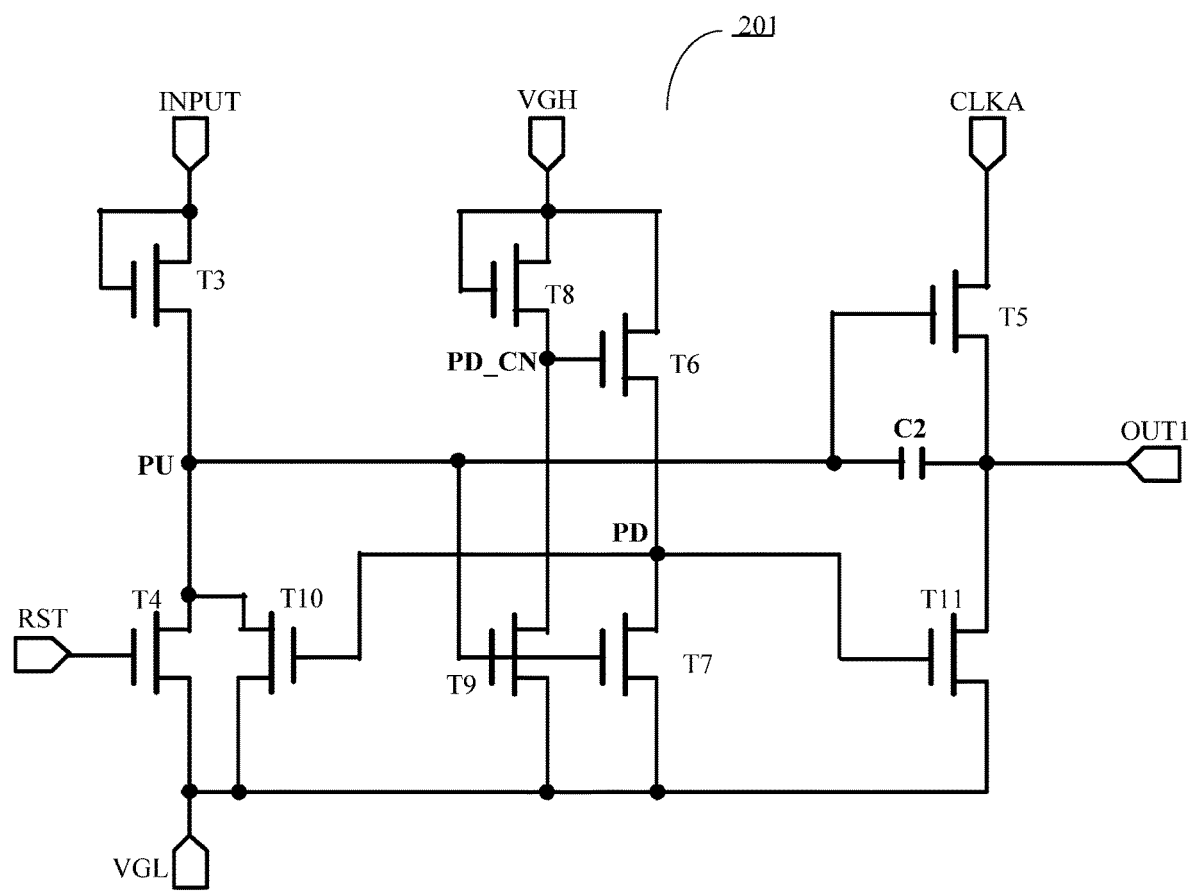
FIG. 6B is a schematic circuit diagram of the shift register unit shown in FIG. 5C.

For example, in an example, the shift register unit 201 shown in FIG. 5B may be embodied as the circuit structure shown in FIG. 6A, and the shift register unit 201 shown in FIG. 5C may be embodied as the circuit structure shown in FIG. 6B in an example. In the following explanation, the description is made by taking the N-type transistor as an example and the embodiments of the present disclosure are not limited thereto.

The input circuit 210 may be implemented as a third transistor T3. A gate of the third transistor T3 is electrically connected with the first electrode and is configured to be connected with the input terminal INPUT to receive the input signal, and a second electrode of the third transistor T3 is configured to be connected with the pull-up node PU. Therefore, when the third transistor T3 turns on due to a turn-on signal (high-level signal) received by the input terminal INPUT, the turn-on signal is used to charge the pull-up node PU to make the pull-up node PU to be at the high level.

The pull-up node reset circuit 220 may be implemented as a fourth transistor T4. A gate of the fourth transistor T4 is configured to be connected with the reset terminal RST to receive the reset signal. A first electrode of the fourth transistor T4 is configured to be connected with the pull-up node PU, and a second electrode of the fourth transistor T4 is configured to be connected with the second voltage terminal VGL to receive the second voltage. When the fourth transistor T4 turns on due to the reset signal, the pull-up node PU is electrically connected with the second voltage terminal VGL, thereby resetting the pull-up node PU, such that the pull-up node PU changes to a low level from a high level.

The output circuit 230 may be implemented as a fifth transistor T5 and a second storage capacitor C2. A gate of the fifth transistor T5 is configured to be connected with the pull-up node PU, a first electrode of the fifth transistor T5 is configured to be connected with the first clock signal terminal CLKA to receive the first clock signal, a second electrode of the fifth transistor T5 is configured to be connected with the first output terminal OUT1; a first electrode of the second storage capacitor C2 is configured to be connected with the gate of the fifth transistor T5, and a second electrode of the second storage capacitor C2 is connected with the second electrode of the fifth transistor T5.

The pull-down circuit 240 may include a sixth transistor T6 and a seventh transistor T7. For example, as shown in FIG. 6A, in an example, a gate of the sixth transistor T6 is configured to be connected with the pull-down control node PD_CN, a first electrode of the sixth transistor T6 is configured to be connected with the second clock signal terminal CLKB to receive the second clock signal, and a second electrode of the sixth transistor T6 is configured to be connected with the pull-down node PD.

For example, as shown in FIG. 6B, in another example, the gate of the sixth transistor T6 is configured to be connected with the pull-down control node PD_CN, the first electrode of the sixth transistor T6 is configured to be connected with the first voltage terminal VGH to receive the first voltage, and the second electrode of the sixth transistor T6 is configured to be connected with the pull-down node PD.

For example, as shown in FIGS. 6A and 6B, a gate of the seventh transistor T7 is configured to be connected with the pull-up node PU, a first electrode of the seventh transistor T7 is configured to be connected with the pull-down node PD, and a second electrode of the seventh transistor T7 is configured to be connected with the second voltage terminal VGL to receive the second voltage.

The pull-down control circuit 250 may include an eighth transistor T8 and a ninth transistor T9. For example, as shown in FIG. 6A, in an example, a gate of the eighth transistor T8 is configured to be electrically connected with its own first electrode, the gate and the first electrode of the eighth transistor T8 are configured to be connected with the second clock signal terminal CLKB to receive the second clock signal, and a second electrode of the eighth transistor T8 is configured to be connected with the pull-down control node PD_CN.

For example, as shown in FIG. 6B, in another example, the gate of the eighth transistor T8 is configured to be electrically connected with its own first electrode, the gate and the first electrode of the eighth transistor T8 are configured to be connected with the first voltage terminal VGH to receive the first voltage, and the second electrode of the eighth transistor T8 is configured to be connected with the pull-down control node PD_CN.

For example, as shown in FIGS. 6A and 6B, a gate of the ninth transistor T9 is configured to be connected with the pull-up node PU, a first electrode of the ninth transistor T9 is configured to be connected with the pull-down control node PD_CN, and a second electrode of the ninth transistor T9 is configured to be connected with the second voltage terminal VGL to receive the second voltage.

The pull-up node noise reduction circuit 260 may be implemented as a tenth transistor T10. A gate of the tenth transistor T10 is configured to be connected with the pull-down node PD, a first electrode is configured to be connected with the pull-up node PU, and a second electrode is configured to be connected with the second voltage terminal VGL to receive the second voltage. The tenth transistor T10 turns on when the pull-down node PD is at the high level, and the pull-up node PU is connected with the second voltage terminal VGL, thereby reducing noise at the pull-up node PU.

The output noise reduction circuit 270 may be implemented as an eleventh transistor T11. A gate of the eleventh transistor T11 is configured to be connected with the pull-down node PD, a first electrode of the eleventh transistor T11 is configured to be connected with the first output terminal OUT1, and a second electrode of the eleventh transistor T11 is configured to be connected with the second voltage terminal VGL to receive the second voltage. The eleventh transistor T11 turns on when the pull-down node PD is at the high level, and the first output terminal OUT1 is connected with the second voltage terminal VGL, thereby reducing noise at the first output terminal OUT1.

It should be noted that the transistors in the embodiments of the present disclosure may be thin film transistors, field effect transistors or switch devices with the same other characteristics, and the embodiments of the present disclosure will be explained by taking the thin film transistors as an example. The source and drain of the transistor herein may be symmetrical structurally, so the source and drain may be structurally indistinguishable. In the embodiments of the present disclosure, in order to distinguish the two electrodes of the transistor except the gate, one electrode is directly described as the first electrode and the other electrode is described as the second electrode.

In addition, the transistors in the shift register unit according to the embodiments of the present disclosure are all described as N-type transistors as an example. In this case, the first electrode of the transistor is a source and the second electrode is a drain. It should be noted that the present disclosure is not limited thereto. For example, one or more transistors in the shift register unit according to the embodiments of the present disclosure may also adopt P-type transistors, and in this case, the first electrode of the transistor is a source and the second electrode is a drain, and each electrode of each transistor of the selected type is correspondingly connected to other elements with reference to each electrode of a corresponding transistor in the embodiment of the present disclosure.

For example, as shown in FIG. 6A or 6B, the transistors in the shift register unit 201 all adopt N-type transistors, the first voltage terminal VGH keeps inputting the DC first voltage with a high level, the second voltage terminal VGL keeps inputting the DC second voltage with a low level, the first clock signal terminal CLKA is input with the first clock signal, and the second clock signal terminal CLKB is input with the second clock signal.

Figure 7A:
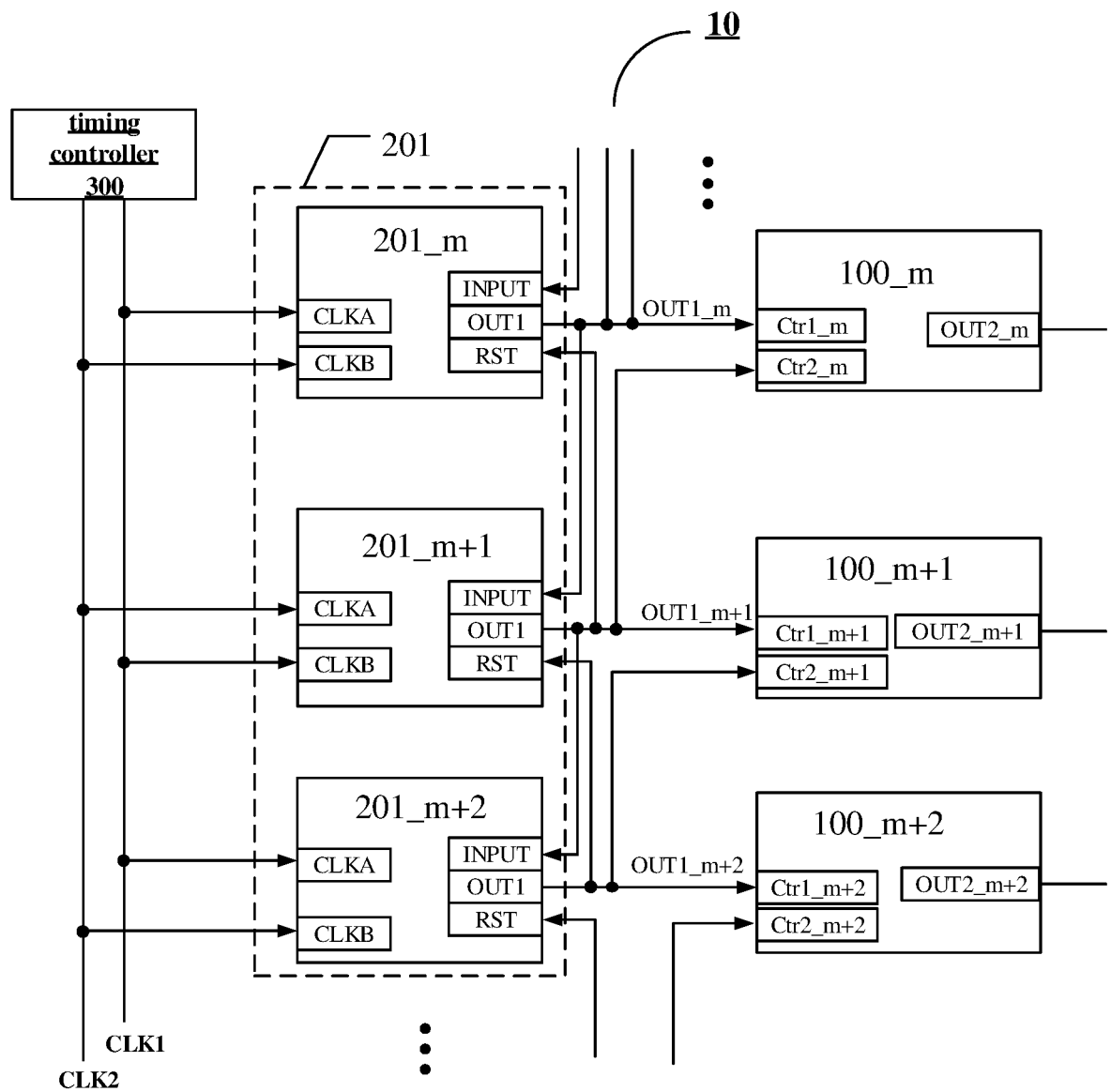
FIG. 7A is a schematic diagram of a gate driver circuit according to an embodiment of the present disclosure.

For example, as shown in FIG. 7A, the present disclosure further provides a gate driver circuit 10 which includes a plurality of cascaded shift register units 201 (for example, a shift register unit 201_m at the mth stage, a shift register unit 201_m+1 at the (m+1)th stage, a shift register unit 201_m+2 at the (m+2)th stage shown in FIG. 7A) and level conversion circuits 100 in one-to-one correspondence with the plurality of cascaded shift register units 201 (for example, the level conversion circuit 100_m at the mth stage, the level conversion circuit 100_m+1 at the (m+1)th stage, the level conversion circuit 100_m+2 at the (m+2)th stage shown in FIG. 7A). For example, the level conversion circuit 100 in this example may be the level conversion circuit shown in FIG. 4A. Each level conversion circuit 100 includes a first control terminal Ctr1 and a second control terminal Ctr2. For example, the shift register unit 201 in this example may be the shift register unit shown in FIG. 6A.

For example, in this example, the gate driver circuit 10 further includes a first clock signal line CLK1 and a second clock signal line CLK2. For example, the first control terminal Ctr1_m of the level conversion circuit 100_m at the mth stage is connected with the first output terminal OUT1_m of the shift register unit 201_m at the mth stage, and the second control terminal Ctr2_m of the level conversion circuit 100_m at the mth stage is connected with the first output terminal OUT_m+1 of the shift register unit at the (m+1)th stage. It should be noted that the gate driver circuit may include four, six, eight or more clock signal lines. The number of clock signal lines is determined based on actual requirements, and is not limited in the embodiments of the present disclosure.

For example, as shown in FIG. 7A, each of the shift register units 201 further includes a first clock signal terminal CLKA and a second clock signal terminal CLKB, and is configured to be connected with the first clock signal terminal CLK1 or the second clock signal line CLK2 to receive the first clock signal or the second clock signal. The first clock signal line CLK1 is connected with the first clock signal terminal CLKA of the shift register unit at the (2n−1)th (n is an integer greater than 0) stage and the second clock signal terminal CLKB of the shift register unit at the 2nth stage, and the second clock signal line CLK2 is connected with the first clock signal terminal CLKA of the shift register unit at the 2nth stage and the second clock signal terminal CLKB of the shift register unit at the (2n−1)th stage. It should be noted that the embodiments of the present disclosure include, but are not limited to the above-mentioned connection. For example, the following connection manner may be adopted: the first clock signal line CLK1 is connected with the first clock signal terminal CLKA of the shift register unit at the 2nth stage and the second clock signal terminal CLKB of the shift register unit at the (2n−1)th stage, and the second clock signal line CLK2 is connected with the first clock signal terminal CLKA of the shift register unit at the (2n−1)th stage and the second clock signal terminal CLKB of the shift register unit at the 2nth stage, which is not limited in the embodiments of the present disclosure.

It should be noted that in FIG. 7A, OUT1_m shown represents the first output terminal of the shift register unit 201_m at the mth stage, OUT1_m+1 represents the first output terminal of the shift register unit 201_m+1 at the (m+1)th stage, and OUT1_m+2 represents the first output terminal of the shift register unit 201_m+2 at the (m+2)th stage. In FIG. 7A, OUT2_m represents the second output terminal of the shift register unit 100_m at the mth stage, OUT2_m+1 represents the second output terminal of the shift register unit 100_m+1 at the (m+1)th stage and OUT2_m+2 represents the second output terminal of the shift register unit 100_m+2 at the (m+2)th stage. The reference numerals in each embodiment are similar to these and are not repeated.

For example, as shown in FIG. 7A, the reset terminals RST of the shift register units at stages other than the last stage are connected with the first output terminal OUT1 of the shift register unit at the next stage. The input terminals INPUT of the shift register units at stages other than the first stage are connected with the first output terminal OUT1 of the shift register unit at the previous stage.

For example, the input terminal INPUT of the shift register unit at the first stage may be configured to receive the trigger signal STV, and the reset terminal RST of the shift register unit at the last stage may be configured to receive the reset signal RESET. For the sake of conciseness, the trigger signal STV and the reset signal RESET are not shown in FIG. 7A.

For example, as shown in FIG. 7A, the gate driver circuit 10 may further include a timing controller 300. For example, the timing controller 300 may be configured to be connected with the first clock signal line CLK1 and the second clock signal line CLK2, so as to provide the first and second clock signals for each shift register unit. For example, the timing controller 300 may further be configured to provide the trigger signal STV and the reset signal RESET.

Figure 8:
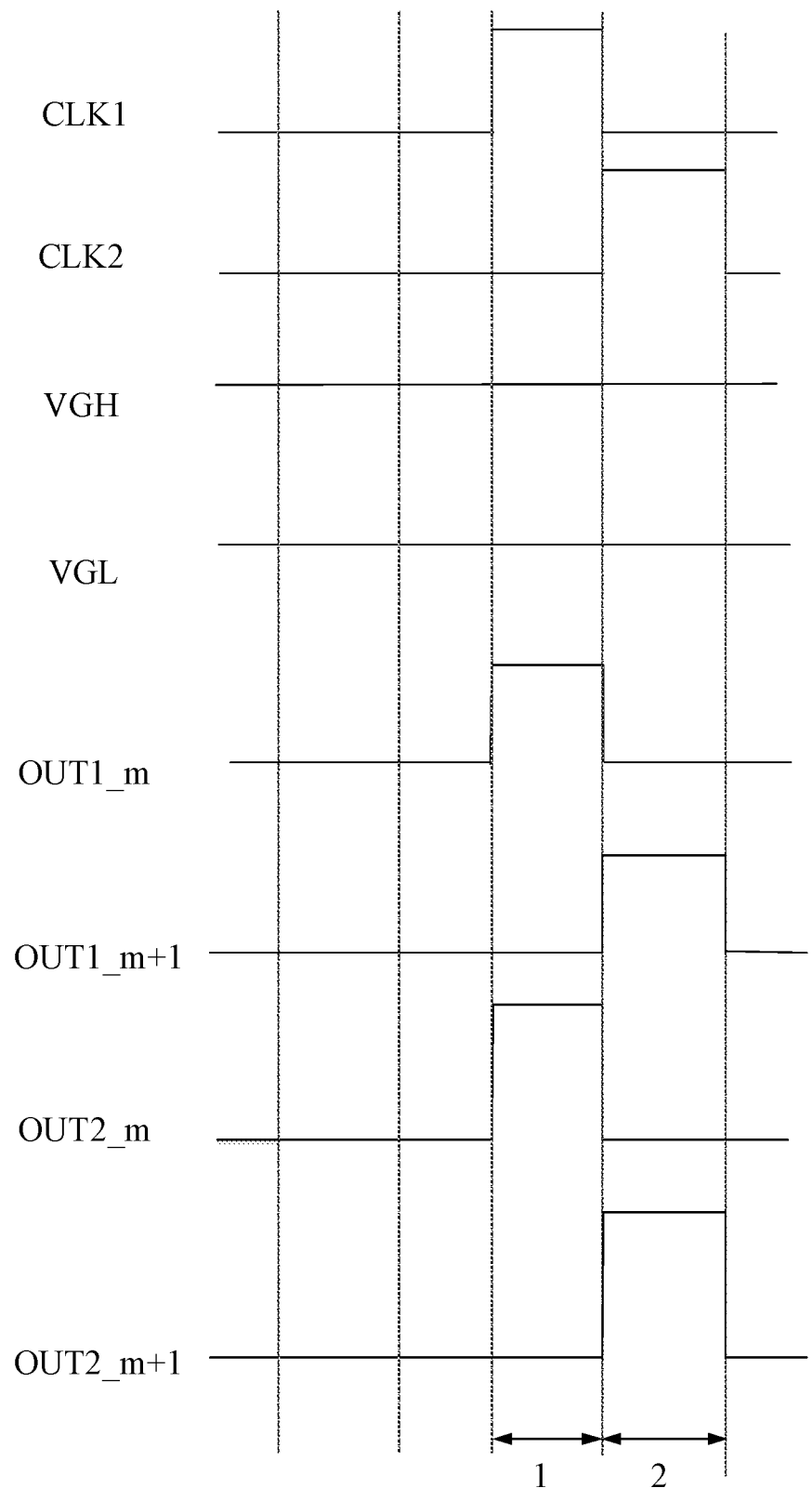
FIG. 8 is a signal timing diagram of the operation of the gate driver circuit shown in FIG. 7A or 7B during.

For example, the clock signal timing provided on the first and second clock signal lines CLK1 and CLK2 may adopt the signal timing shown in FIG. 8, so as to implement the function of the gate driver circuit 10 outputting the gate scan signal row by row.

Figure 7B:
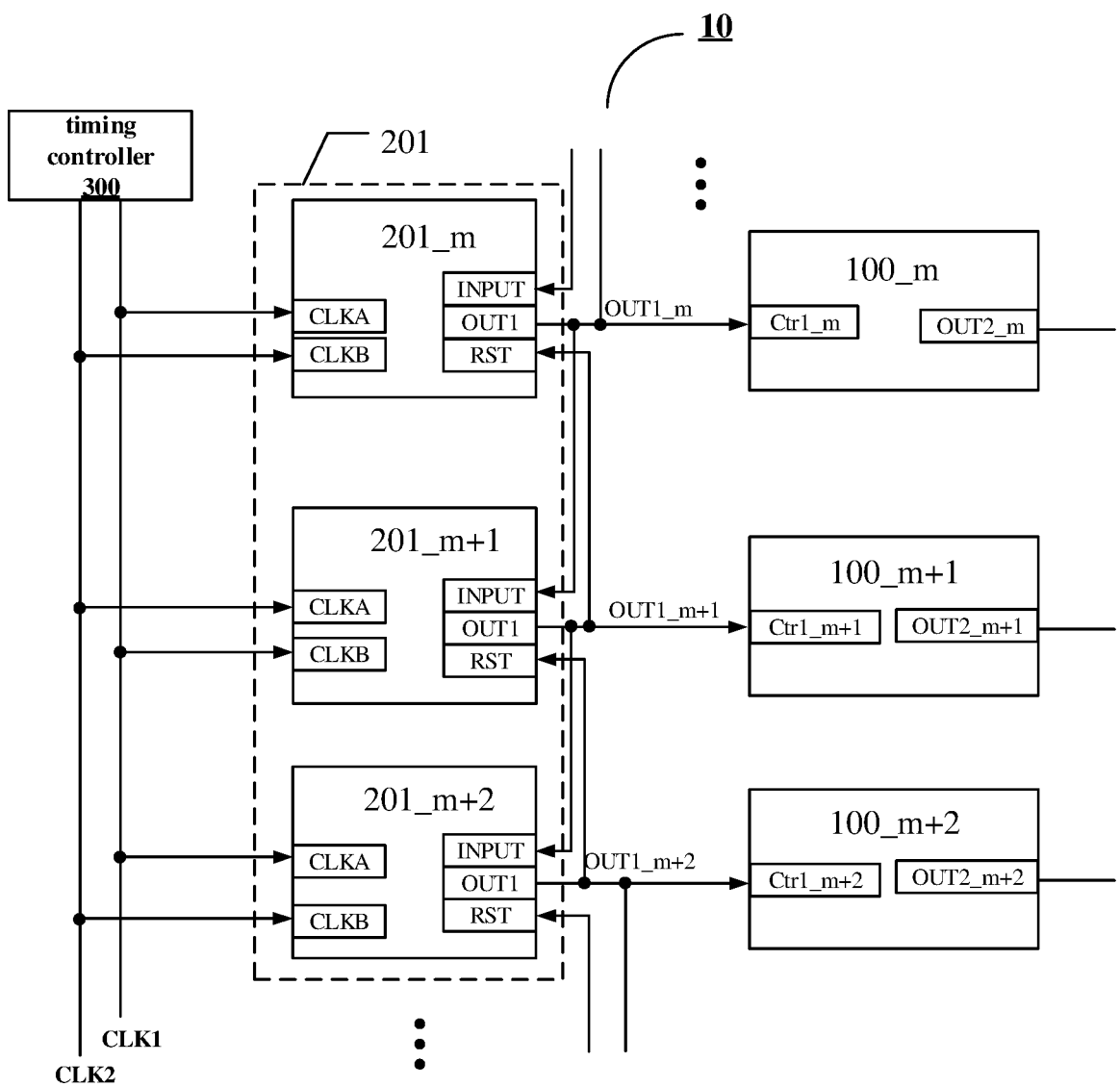
FIG. 7B is a schematic diagram of another gate driver circuit according to an embodiment of the present disclosure.

In another example, as shown in FIG. 7B, the gate driver circuit 10 includes a plurality of cascaded shift register units 201 (for example, a shift register unit 201_$m$ at the mth stage, a shift register unit 201_$m$+1 at the (m+1)th stage, a shift register unit 201_$m$+2 at the (m+2)th stage shown in FIG. 7B) and level conversion circuits 100 in one-to-one correspondence with the plurality of cascaded shift register units 201 (for example, the level conversion circuit 100_$m$ at the mth stage, the level conversion circuit 100_$m$+1 at the (m+1)th stage, the level conversion circuit 100_$m$+2 at the (m+2)th stage shown in FIG. 7B). The gate driver circuit 10 has a similar structure to the gate driver circuit 10 shown in FIG. 7A except that each level conversion circuit 100 only includes a first control terminal Ctrl (for example, as shown in FIG. 7B, the level conversion circuit 100_$m$ at the mth stage includes a first control terminal Ctrl_$m$ and a second output terminal OUT2_$m$, the level conversion circuit 100_$m$+1 at the (m+1)th stage includes a first control terminal Ctrl_$m$+1 and a second output terminal OUT2_$m$+1, the level conversion circuit 100_$m$+2 at the (m+2)th stage includes a first control terminal Ctrl_$m$+2 and a second output terminal OUT2_$m$+2), and the first control terminal Ctrl is connected with the first output terminal OUT1 of the shift register unit 201 at the same stage as the first control terminal Ctrl. For example, the first control terminal Ctrl_$m$ of the level conversion circuit 100_$m$ at the mth stage is connected with the first output terminal OUT1_$m$ of the shift register unit at the mth stage. For example, the level conversion circuit 100 in this example may be the level conversion circuit shown in FIG. 4B or 4C. In this example, other parts of the gate driver circuit may refer to the description about the gate driver circuit shown in FIG. 7A, the description of which is not repeated herein.

The working principle of the gate driver circuit 10 shown in FIG. 7A will be explained in combination with the signal timing diagram shown in FIG. 8. In the first and second periods 1 and 2 shown in FIG. 8, the gate driver circuit 10 may operate as follows respectively.

It should be noted that as shown in FIG. 8, in this example, during the first period, the first pulse scan signal output by the shift register unit is at the first level, and during the second period, the first pulse scan signal output by the shift register unit is at the second level.

Figure 9A:
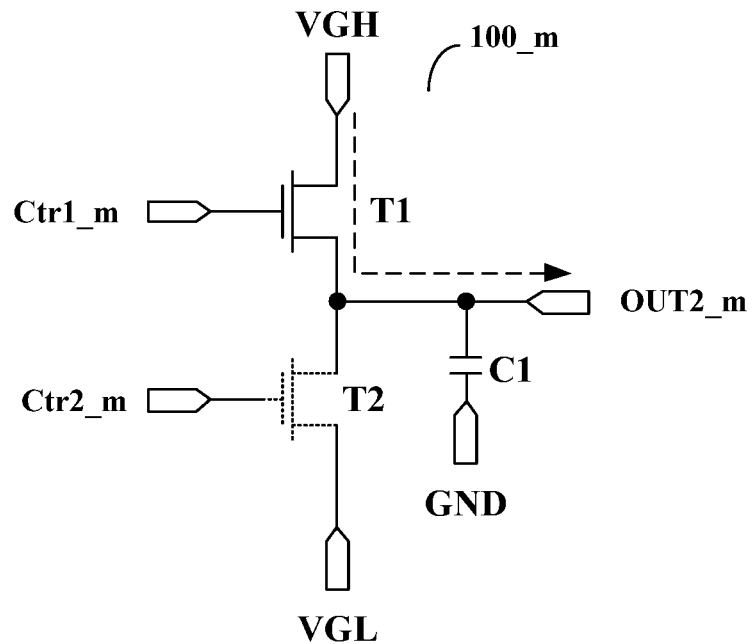
FIGS. 9A and 9B are schematic circuit diagrams of the level conversion circuit shown in FIG. 4A corresponding to the signal timing diagram in FIG. 8.
Figure 9B:
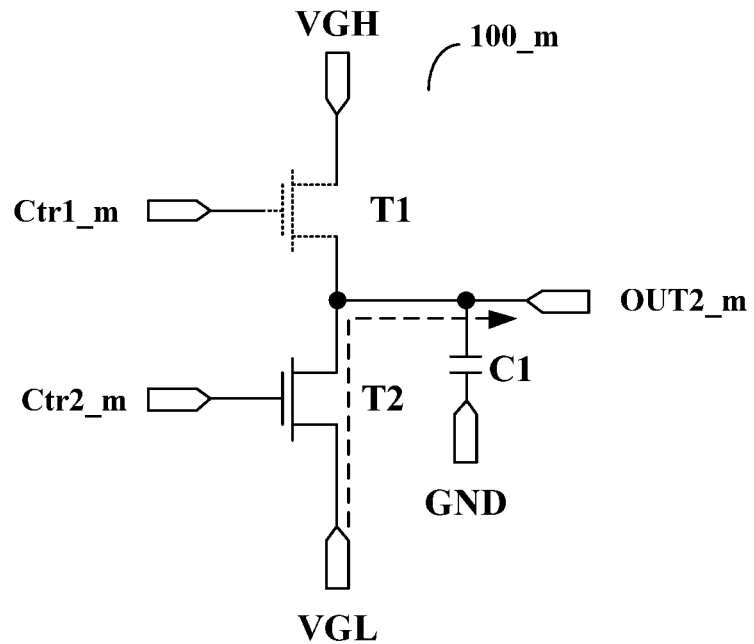

It should be noted that FIG. 9A is a schematic diagram when the level conversion circuit 100 shown in FIG. 4A is in the first period 1 and FIG. 9B is a schematic diagram when the level conversion circuit 100 shown in FIG. 4A is in the second period 2. Additionally, in FIGS. 9A and 9B, a dashed line means that the transistors are in turned-off states during the corresponding period, and a dashed line with an arrow represents a current direction of the level conversion circuit 100 during the corresponding period. In FIGS. 9A and 9B, the description is made by taking N-type transistors as an example, i.e., the gate of each transistor turns on in case of a high-level (first level) is input, and turns off in case of a low-level (second level) is input.

During the first period 1, the first clock signal line CLK1 provides a high-level signal. As shown in FIG. 7A, since the first clock signal terminal CLKA of the shift register unit 201_$m$ at the mth stage is connected with the first clock signal line CLK1, the first clock signal terminal CLKA of the shift register unit 201_$m$ at the mth stage during this period has a high-level signal; since the pull-up node (not shown) of the shift register unit 201_$m$ at the mth stage is at the high level, under the control of the high level of the pull-up node, the high level input from the first clock signal terminal CLKA is output to the first output terminal OUT1_$m$ of the shift register unit 201_$m$ at the mth stage as the first level of the first pulse scan signal output from the shift register unit 201_$m$ at the mth stage. It should be noted that the high or low potential in the signal timing diagram shown in FIG. 8 is only schematic, without representing an actual potential value or a relative ratio, and for the above-mentioned example, the high-level signal corresponds to a turn-on signal of the N-type transistor, and the low-level signal corresponds to a turn-off signal of the N-type transistor. For example, the high level provided by the first and second clock signal lines CLK1 and CLK2 is 3.3V, so the first pulse scan signal output form the first output terminal OUT1_$m$ of the shift register unit 201_$m$ at the mth stage has a first level of about 3.3V.

As shown in FIGS. 8 and 9A, during the first period 1, the first transistor T1 turns on in response to the first level of the first pulse scan signal output from the first output terminal OUT1_$m$ of the shift register unit 201_$m$ at the mth stage and received by the first control terminal Ctrl_$m$, and meanwhile, the second transistor T2 turns off in response to the second level of the first pulse scan signal output from the first output terminal OUT1_$m$+1 of the shift register unit 201 at the (m+1)th stage and received by the second control terminal Ctr2_$m$.

As shown in FIG. 9A, during the first period 1, the level conversion circuit 100_$m$ at the mth stage shown in FIG. 4A forms an output path (as shown by the dashed line with an arrow in FIG. 9A) of the second pulse scan signal. Since the first pulse scan signal received by the first control terminal Ctrl_$m$ is at the first level during this period, the first voltage terminal VGH is connected with the second output terminal OUT2_$m$, and the first storage capacitor C2 is charged. Therefore, during this period, the second output terminal OUT2_$m$ of the level conversion circuit 100_$m$ at the mth stage outputs the first voltage VGH.

During the second period, the second clock signal line CLK2 provides a high-level signal. As shown in FIG. 7A, since the first clock signal terminal CLKA of the shift register unit 201_$m$+1 at the (m+1)th stage is connected with the second clock signal line CLK2, the first clock signal terminal CLKA of the shift register unit 201_$m$+1 at the (m+1)th stage during this period has a high-level signal; since the pull-up node (not shown) of the shift register unit 201_$m$+1 at the (m+1)th stage is at the high level, the high level input from the first clock signal terminal CLKA is output under the control of the high level of the pull-up node to the first output terminal OUT1_$m$+1 of the shift register unit 201_$m$+1 at the (m+1)th stage, as the first level of the first pulse scan signal output from the shift register unit 201_$m$+1 at the (m+1)th stage. Meanwhile, during this period, the first clock signal line CLK1 provides a low level, so during this period, the first output terminal OUT1_$m$ of the shift register unit 201_$m$ at the mth stage outputs a low level as the second level of the first pulse scan signal output from the shift register unit 201_$m$ at the mth stage.

As shown in FIGS. 8 and 9B, during the second period 2, the first transistor T1 turns off in response to the second level of the first pulse scan signal output from the first output terminal OUT1_$m$ of the shift register unit 201_$m$ at the mth stage and received by the first control terminal Ctr1_$m$, and meanwhile, the second transistor T2 turns of in response to the first level of the first pulse scan signal output from the first output terminal OUT1_$m$+1 of the shift register unit 201_$m$+1 at the (m+1)th stage and received by the second control terminal Ctr2_$m$.

As shown in FIG. 9A, during the second period, the level conversion circuit 100_$m$ at the mth stage shown in FIG. 4A forms an output path (as shown by the dashed line with an arrow in FIG. 9B) of the second pulse scan signal. Since during this period, the first pulse scan signal received by the second control terminal Ctr2_$m$ is at the first level so that the second voltage terminal VGL is connected with the second output terminal OUT2_$m$, and the first storage capacitor C1 discharges to the second voltage VGL. Therefore, during this period, the level conversion circuit 100_$m$ outputs a second voltage, and keeps the second voltage VGL until the first pulse scan signal received by the first control terminal Ctr1_$m$ is at the first level, thereby guaranteeing the consistency of the phase of the signal after and before level conversion, so as to meet the voltage requirement of the display panel. Meanwhile, the second output terminal OUT2_$m$+1 of the level conversion circuit 100_$m$+1 at the (m+1)th stage outputs the first voltage. The working principle of the level conversion circuit 100_$m$+1 at the (m+1)th stage is similar to that of the level conversion circuit 100_$m$ at the mth stage shown in FIG. 9A, and is not repeated herein.

The working principle of the gate driver circuit shown in FIG. 7B is similar to that of the gate driver circuit shown in FIG. 7A, and is not repeated herein.

Figure 10A:
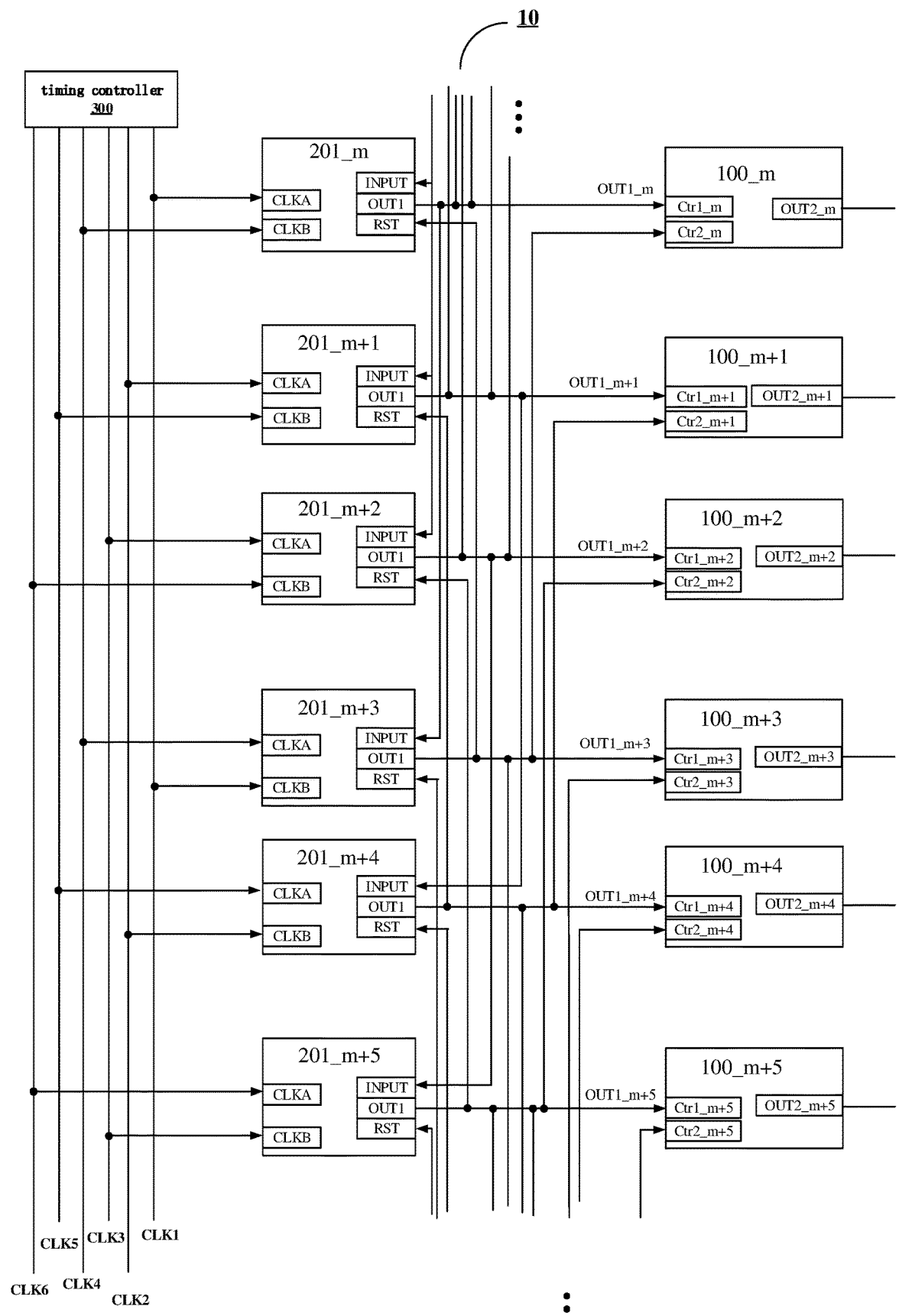
FIG. 10A is a schematic diagram of another gate driver circuit according to an embodiment of the present disclosure.

FIG. 10A shows a gate driver circuit 10 in another example according to an embodiment of the present disclosure. The gate driver circuit shown in FIG. 10A has a similar structure to the gate driver circuit shown in FIG. 7A except that the gate driver circuit 10 includes a first clock signal line CLK1, a second clock signal line CLK2, a third clock signal line CLK3, a fourth clock signal line CLK4, a fifth clock signal line CLK5 and a sixth clock signal line CLK6, and the first control terminal Ctr1_$m$ of the level conversion circuit 100_$m$ at the mth stage of the gate driver circuit 10 is connected with the first output terminal OUT1_$m$ of the shift register unit 201_$m$ at the mth stage, and the second control terminal Ctr2_$m$ of the level conversion circuit 100_$m$ at the mth stage is connected with the first output terminal OUT_$m$+3 of the shift register unit 201_$m$+1 at the (m+3)th stage.

For example, as shown in FIG. 10A, the first clock signal line CLK1 is for example connected with the first clock signal terminal CLKA of the shift register unit at the (6n−5)th (n is an integer greater than 0) stage and the second clock signal terminal CLKB of the shift register unit at the (6n−2)th stage; the second clock signal line CLK2 is for example connected with the first clock signal terminal CLKA of the shift register unit at the (6n−4)th stage and the second clock signal terminal CLKB of the shift register unit at the (6n−1)th stage; the third clock signal line CLK3 is for example connected with the first clock signal terminal CLKA of the shift register unit at the (6n−3)th stage and the second clock signal terminal CLKB of the shift register unit at the 6nth stage; the fourth clock signal line CLK4 is for example connected with the first clock signal terminal CLKA of the shift register unit at the (6n−2)th stage and the second clock signal terminal CLKB of the shift register unit at the (6n−5)th stage; the fifth clock signal line CLK5 is for example connected with the first clock signal terminal CLKA of the shift register unit at the (6n−1)th stage and the second clock signal terminal CLKB of the shift register unit at the (6n−4)th stage; the sixth clock signal line CLK6 is for example connected with the first clock signal terminal CLKA of the shift register unit at the 6nth stage and the second clock signal terminal CLKB of the shift register unit at the (6n−3)th stage. It should be noted that the embodiment of the present disclosure may further include other connections, and is not limited thereto.

For example, as shown in FIG. 10A, the reset terminal RST of the shift register units at a stage other than the last three stages is connected with the first output terminal OUT1 of the shift register unit at the third stage after the stage. For example, the reset terminal RST of the shift register unit at the (6n−5)th stage is connected with the first output terminal OUT1 of the shift register unit at the (6n−3)th stage. The input terminal INPUT of the shift register units at a stage other than the first, second and third stages is connected with the first output terminal OUT1 of the shift register unit at the third stage before the stage. For example, the input terminal INPUT of the shift register unit at the 6nth stage is connected with the first output terminal OUT1 of the shift register unit at the (6n−2)th stage.

For example, the input terminals INPUT of the shift register units at the first, second and third stages may be configured to receive the trigger signal STV, and the reset terminals RST of the shift register units at the last three stages may be configured to receive the reset signal RESET. For the sake of conciseness, the trigger signal STV and the reset signal RESET are not shown in FIG. 10A.

For example, as shown in FIG. 10A, the gate driver circuit 10 may further include a timing controller 300. For example, the timing controller 300 may be configured to be connected with the first clock signal line CLK1, the second clock signal line CLK2, the third clock signal line CLK3, the fourth clock signal line CLK4, the fifth clock signal line CLK5 and the sixth clock signal line CLK6 so as to provide the clock signal for each shift register unit.

Figure 10B:
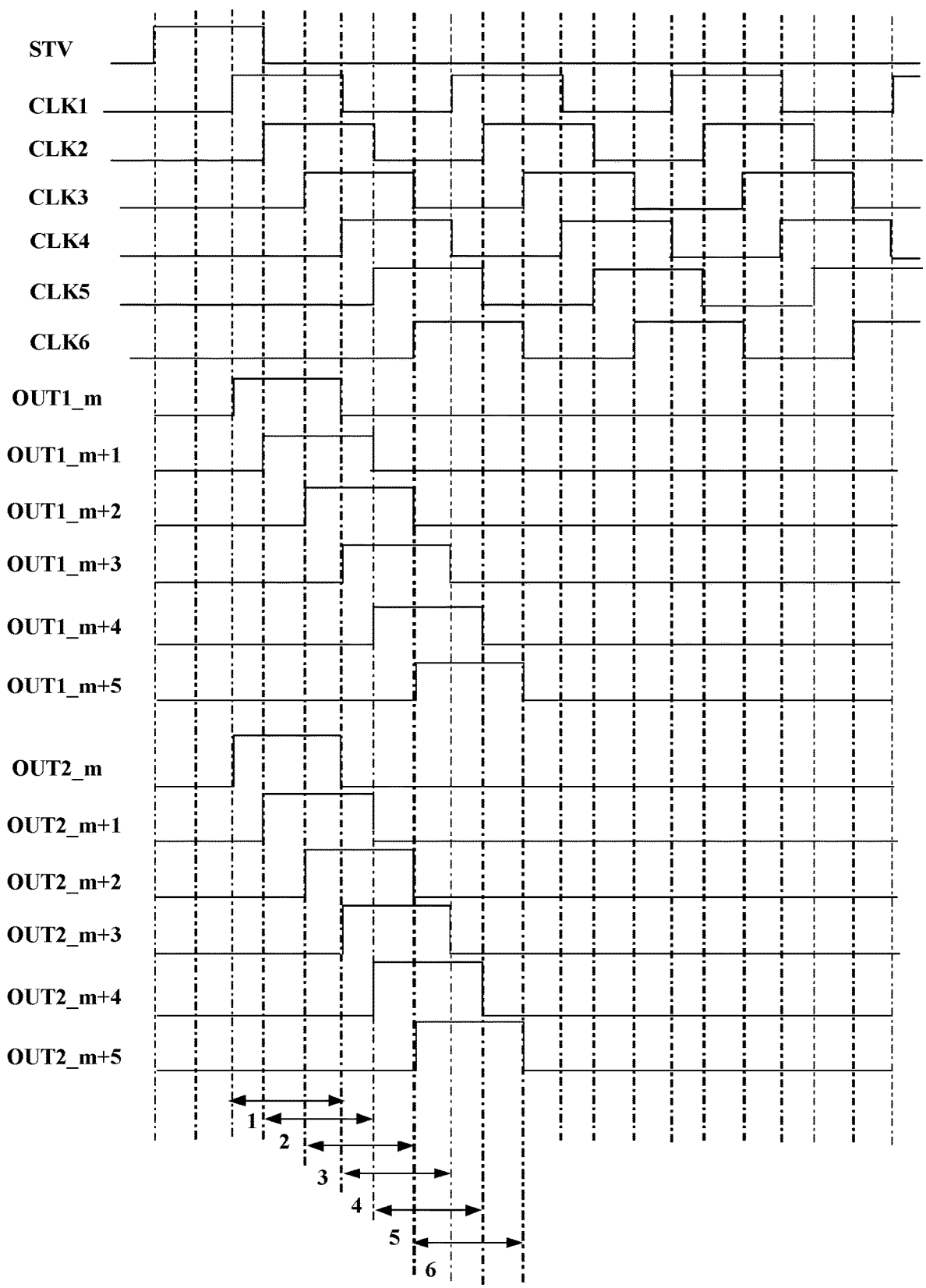
FIG. 10B is a signal timing diagram of the operation of the gate driver circuit shown in FIG. 10A.

For example, the clock signal timing provided on the first clock signal line CLK1, the second clock signal line CLK2, the third clock signal line CLK3, the fourth clock signal line CLK4, the fifth clock signal line CLK5 and the sixth clock signal line CLK6 may adopt the signal timing shown in FIG. 10B, so as to implement the function of the gate driver circuit 10 outputting the gate scan signal row by row.

The working principle of the gate driver circuit 10 shown in FIG. 10A will be explained in combination with the signal timing diagram shown in FIG. 10B. As shown in FIG. 10B, the working principle of the gate driver circuit 10 shown in FIG. 10A is similar to that of the gate driver circuit shown in FIG. 7A, and is not repeated herein. The working principle of the gate driver circuit shown in FIG. 10A is as follows.

During the first period 1, the high level input from the first clock signal line CLK1 is output to the first output terminal OUT1_$m$ of the shift register unit 201_$m$ at the mth stage, as the first level of the first pulse scan signal output from the shift register unit 201_$m$ at the mth stage; the second output terminal OUT2_$m$ of the level conversion circuit 100_$m$ at the mth stage outputs the first voltage, as the first level of the second pulse scan signal output from the level conversion circuit 100_*m* at the mth stage.

During the second period 2, the high level input from the second clock signal line CLK2 is output to the first output terminal OUT1_*m*+1 of the shift register unit 201_*m*+1 at the (m+1)th stage, as the first level of the first pulse scan signal output from the shift register unit 201 at the (m+1)th stage; the second output terminal OUT2_*m*+1 of the level conversion circuit 100_*m*+1 at the (m+1)th stage outputs the first voltage, as the first level of the second pulse scan signal output from the level conversion circuit 100_*m*+1 at the (m+1)th stage.

During the third period 3, the high level input from the third clock signal line CLK3 is output to the first output terminal OUT1_*m*+2 of the shift register unit 201_*m*+2 at the (m+2)th stage, as the first level of the first pulse scan signal output from the shift register unit 201_*m*+2 at the (m+2)th stage; the second output terminal OUT2_*m*+1 of the level conversion circuit 100_*m*+2 at the (m+2)th stage outputs the first voltage, as the first level of the second pulse scan signal output from the level conversion circuit 100_*m*+2 at the (m+2)th stage.

During the fourth period 4, the high level input from the fourth clock signal line CLK4 is output to the first output terminal OUT1_*m*+3 of the shift register unit 201_*m*+3 at the (m+3)th stage, as the first level of the first pulse scan signal output from the shift register unit 201_*m*+3 at the (m+3)th stage; the second output terminal OUT2_*m*+3 of the level conversion circuit 100_*m*+3 at the (m+3)th stage outputs the first voltage, as the first level of the second pulse scan signal output from the level conversion circuit 100_*m*+3 at the (m+3)th stage; the second output terminal OUT2_*m* of the level conversion circuit 100_*m* at the mth stage outputs and keeps the second voltage as the second level of the second pulse scan signal output from the level conversion circuit 100_*m* at the mth stage, until the first pulse scan signal received by the first control terminal Ctr1_*m* of the level conversion circuit 100_*m* at the mth stage is at the first level.

During the fifth period 5, the high level input from the fifth clock signal line CLK5 is output to the first output terminal OUT1_*m*+4 of the shift register unit 201_*m*+4 at the (m+4)th stage, as the first level of the first pulse scan signal output from the shift register unit 201_*m*+4 at the (m+4)th stage; the second output terminal OUT2_*m*+4 of the level conversion circuit 100_*m*+4 at the (m+4)th stage outputs the first voltage, as the first level of the second pulse scan signal output from the level conversion circuit 100_*m*+4 at the (m+4)th stage; the second output terminal OUT2_*m*+1 of the level conversion circuit 100_*m*+1 at the (m+1)th stage outputs and keeps the second voltage as the second level of the second pulse scan signal output from the level conversion circuit 100_*m*+1 at the (m+1)th stage, until the first pulse scan signal received by the first control terminal Ctr1_*m*+1 of the level conversion circuit 100_*m*+1 at the (m+1)th stage is at the first level.

During the sixth period 6, the high level input from the sixth clock signal line CLK6 is output to the first output terminal OUT1_*m*+5 of the shift register unit 201_*m*+5 at the (m+5)th stage, as the first level of the first pulse scan signal output from the shift register unit 201_*m*+5 at the (m+5)th stage; the second output terminal OUT2_*m*+5 of the level conversion circuit 100_*m*+5 at the (m+5)th stage outputs the first voltage, as the second pulse scan signal output from the level conversion circuit 100_*m*+5 at the (m+5)th stage; the second output terminal OUT2_*m*+2 of the level conversion circuit 100_*m*+2 at the (m+2)th stage outputs and keeps the second voltage as the second level of the second pulse scan signal output from the level conversion circuit 100_*m*+2 at the (m+2)th stage, until the first pulse scan signal received by the first control terminal Ctr1_*m*+2 of the level conversion circuit 100_*m*+2 at the (m+2)th stage is at the first level.

It should be noted that as shown in FIG. 8, the first pulse scan signal output from the first output terminal OUT1_*m* of the shift register unit 201_*m* at the mth stage and the first pulse scan signal output from the first output terminal OUT1_*m*+1 of the shift register unit 201 at the (m+1)th stage are consecutive in time. That is, when the first pulse scan signal output from the first output terminal OUT1_*m* of the shift register unit 201_*m* at the mth stage ends, the first output terminal OUT1_*m*+1 of the shift register unit 201 at the (m+1)th stage outputs the first pulse scan signal. That is to say, the first output terminal OUT1_*m* of the shift register unit 201_*m* at the mth stage and the first output terminal OUT1_*m*+1 of the shift register unit 201 at the (m+1)th stage do not output signals at the same time. As shown in FIG. 10B, similarly, the first pulse scan signal output from the first output terminal OUT1_*m* of the shift register unit 201_*m* at the mth stage and the first pulse scan signal output from the first output terminal OUT1_*m*+3 of the shift register unit 201 at the (m+3)th stage are consecutive in time.

Figure 10C:
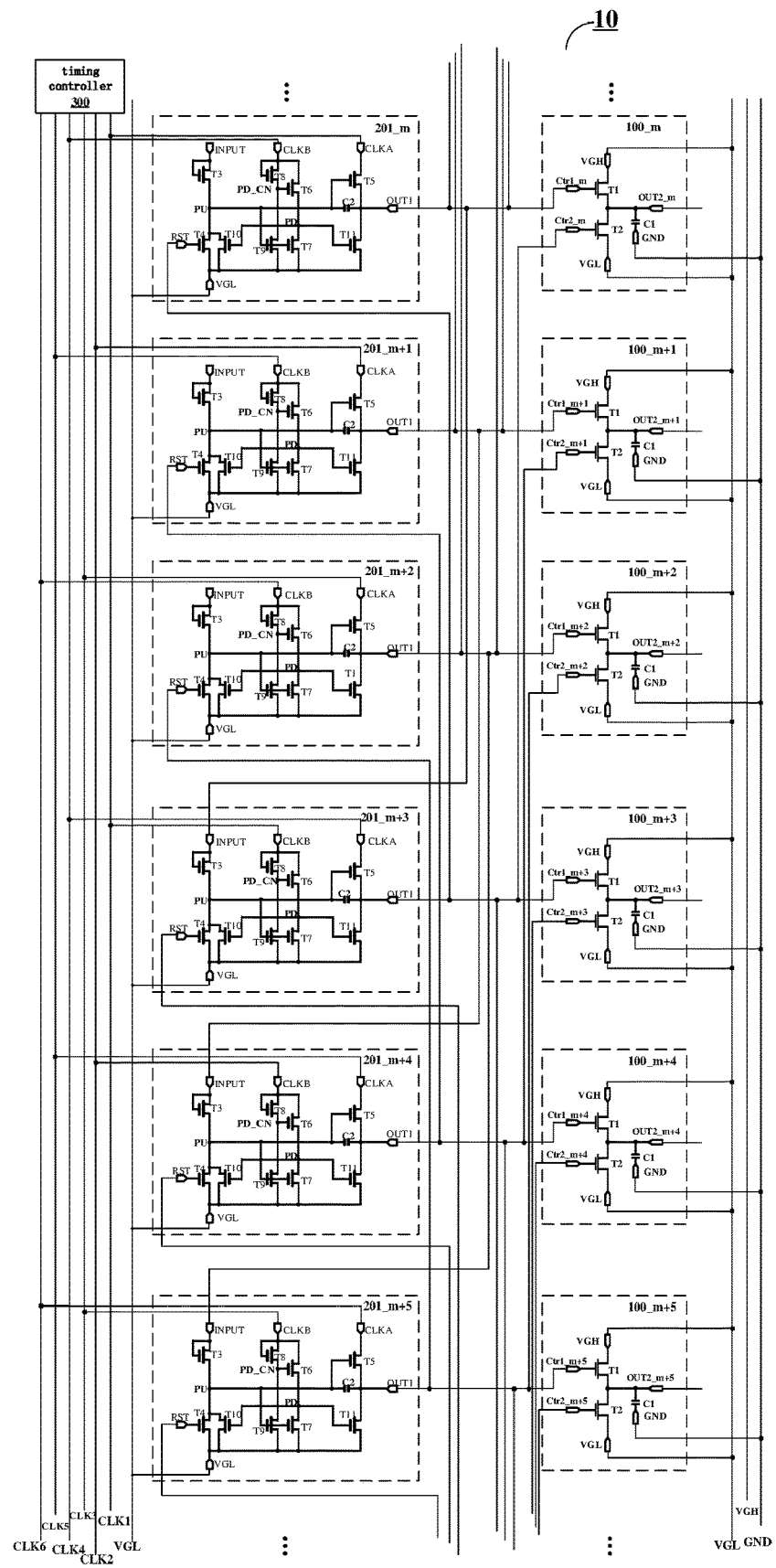
FIG. 10C is a schematic diagram of another gate driver circuit according to an embodiment of the present disclosure.

FIG. 10C shows a gate driver circuit 10 in another example according to at least one embodiment of the present disclosure. FIG. 10C is the same as FIG. 10A except that the particular structures of the shift register unit and the level conversion circuit are shown. As an example, in the gate driver circuit 10 as shown in FIG. 10C, the shift register unit adopts the structure of FIG. 6A, and the level conversion circuit adopts the structure of FIG. 4A. Detailed description of the structures of the shift register unit and the level conversion circuit as shown in FIG. 10C may refer to the above embodiments.

As shown in FIG. 10C, the gate driver circuit 10 includes: a scan signal generation circuit and N2 level conversion circuits. The scan signal generation circuit includes N1 cascaded shift register units, for example an mth shift register unit 201_*m*, an (m+1)th shift register unit 201_*m*+1, an (m+2)th shift register unit 201_*m*+2, an (m+3)th shift register unit 201_*m*+3, an (m+4)th shift register unit 201_*m*+4, an (m+5)th shift register unit 201_*m*+5. Each of the N1 cascaded shift register units comprises a first output terminal OUT1, and the N1 cascaded shift register units are configured to output N1 first pulse scan signals stage by stage respectively through the first output terminals OUT1.

The N2 level conversion circuits are configured to output, under a control of the N1 first pulse scan signals, N1 second pulse scan signals which are in one-to-one correspondence with the N1 first pulse scan signals, where N1 is an integer greater than or equal to 2, and N2 is equal to N1.

Each of the level conversion circuits comprises a first control terminal Ctr1, a second control terminal Ctr2, a second output terminal OUT2, a first transistor T1, a second transistor T2 and a first storage capacitor C1.

The first transistor T1 is configured to be switched on to output a first voltage to the second output terminal OUT2 in a case where the received corresponding first pulse scan signal is at a first level. A gate of the first transistor T1 is configured to be connected with the first control terminal Ctr1 to receive the corresponding first pulse scan signal, a first electrode of the first transistor T1 is configured to be connected with a first voltage terminal VGH to receive the first voltage, and a second electrode of the first transistor is configured to be connected with the second output terminal OUT2.

The second transistor T2 is configured to be switched on to output a second voltage to the second output terminal OUT2 under a control of the received corresponding second sub-control signal, wherein a gate of the second transistor T2 is configured to be connected with the second control terminal OUT2 to receive the corresponding first pulse scan signal, a first electrode of the second transistor is configured to be connected with the second voltage terminal VGL to receive the second voltage, and a second electrode of the second transistor is configured to be connected with the second output terminal OUT2.

The first storage capacitor C1 is configured to control a voltage of the second output terminal OUT2 at the first voltage in a case where the second output terminal OUT2 outputs the first voltage, and to control the voltage of the second output terminal OUT2 at the second voltage in a case where the second output terminal OUT2 outputs the second voltage. A first electrode of the first storage capacitor C1 is configured to be connected with the second output terminal OUT2, a second electrode of the first storage capacitor C1 is configured to be connected with a third voltage terminal GND to receive a third voltage.

Each of the N1 cascaded shift register units further includes an input terminal INPUT, a second voltage terminal VGL, a first clock signal terminal CLKA, a second clock signal terminal CLKB, a reset terminal RST, an input circuit, a first node reset circuit, an output circuit, a second node control circuit, a third node control circuit, a first node noise reduction circuit and an output noise reduction circuit.

The input circuit is configured to electrically connect a first node with the input terminal INPUT under a control of an input signal input at the input terminal INPUT to change a level of the first node. The input circuit comprises a third transistor T3. A gate of the third transistor T3 is configured to be electrically connected with a first electrode of the third transistor T3 and be connected with the input terminal INPUT to receive the input signal, and a second electrode of the third transistor T3 is configured to be connected with a pull-up node PU.

The first node reset circuit is configured to electrically connect the pull-up node PU and the second voltage terminal VGL under a control of a reset signal input at the reset terminal RST to reset the pull-up node PU, and the first node reset circuit comprises a fourth transistor T4. A gate of the fourth transistor T4 is configured to be connected with the reset terminal RST to receive the reset signal, a first electrode of the fourth transistor T4 is configured to be connected with the pull-up node PU and a second electrode of the fourth transistor T4 is configured to be connected with the second voltage terminal VGL to receive the second voltage.

The output circuit is configured to be switched on under a control of a level of the pull-up node PU to electrically connect the first clock signal terminal CLKA and the first output terminal OUT1 and output a first clock signal input at the first clock signal terminal CLKA to the first output terminal OUT1. The output citcuit comprises a fifth transistor T5 and a second storage capacitor C2. A gate of the fifth transistor T5 is configured to be connected with the pull-up node PU, a first electrode of the fifth transistor T5 is configured to be connected with the first clock signal terminal CLKA to receive the first clock signal, a second electrode of the fifth transistor T5 is configured to be connected with the first output terminal OUT1, a first electrode of the second storage capacitor C2 is configured to be connected with the gate of the fifth transistor T5, and a second electrode of the second storage capacitor C2 is connected with the second electrode of the fifth transistor T5.

The second node control circuit is configured to electrically connect the pull-down node PD and one of the second clock signal terminal CLKB and the second voltage terminal VGL under a control of levels of the pull-up node PU and the pull-down control node PD_CN to change a level of the pull-down node PD, and the second node control circuit comprises a sixth transistor T6 and a seventh transistor T7. A gate of the sixth transistor T6 is configured to be connected with the pull-down control node PD_CN, a first electrode of the sixth transistor T6 is configured to be connected with the second clock signal terminal CLKB to receive a second clock signal, and a second electrode of the sixth transistor T6 is configured to be connected with the pull-down node PD. A gate of the seventh transistor T7 is configured to be connected with the pull-up node PU, a first electrode of the seventh transistor T7 is configured to be connected with the pull-down node PD, and a second electrode of the seventh transistor T7 is configured to be connected with the second voltage terminal VGL to receive the second voltage.

The third node control circuit is configured to electrically connect the pull-down control node PD_CN and the second voltage terminal VGL under a control of the level of the pull-up node PU to change a level of the pull-down control node PD_CN. The third node control circuit comprises an eighth transistor T8 and a ninth transistor T9. A gate of the eighth transistor T8 is configured to be electrically connected with a first electrode of the eighth transistor T8, the gate and the first electrode of the eighth transistor T8 are configured to be connected with the second clock signal terminal CLKB to receive the second clock signal, and a second electrode of the eighth transistor T8 is configured to be connected with the pull-down control node PD_CN. A gate of the ninth transistor T9 is configured to be connected with the pull-up node PU, a first electrode of the ninth transistor T9 is configured to be connected with the pull-down control node PD_CN, and a second electrode of the ninth transistor T9 is configured to be connected with the second voltage terminal VGL to receive the second voltage.

The first node noise reduction circuit is configured to electrically connect the pull-up node PU and the second voltage terminal VGL under a control of the level of the pull-down node PD to reduce noise at the pull-up node PU. The first node noise reduction circuit comprises a tenth transistor T10. A gate of the tenth transistor T10 is configured to be connected with the pull-down node PD, a first electrode of the tenth transistor T10 is configured to be connected with the pull-up node PU, and a second electrode of the tenth transistor T10 is configured to be connected with the second voltage terminal VGL to receive the second voltage.

The output noise reduction circuit is configured to electrically connect the first output terminal and the second voltage terminal VGL under a control of the level of the pull-down node PD to reduce noise at the first output terminal OUT1. The output noise reduction circuit comprises an eleventh transistor T11. A gate of the eleventh transistor T11 is configured to be connected with the pull-down node PD, a first electrode of the eleventh transistor T11 is configured to be connected with the first output terminal, and a second electrode of the eleventh transistor T11 is configured to be connected with the second voltage terminal VGL to receive the second voltage.

The first control terminal Ctr1_m of the level conversion circuit 100_m at an mth stage is electrically connected with the first output terminal OUT1 of the shift register unit 201_m at the mth stage to receive the mth first pulse scan signal as the first sub-control signal, and the second control terminal Ctr2_m of the level conversion circuit 100_m at the mth stage is electrically connected with the first output terminal OUT1 of the shift register unit 201_m+3 at an (m+3)th stage to receive the (m+3)th first pulse scan signal as the second sub-control signal, and m is an integer greater than or equal to 1, and m+3 is less than or equal to N1.

A pulse of the mth first pulse scan signal and a pulse of the (m+3)th first pulse scan signal do not temporally overlap.

The reset terminal RST of the shift register unit at a kth stage is connected with the first output terminal of the shift register unit at a (k+3)th stage, wherein k is an integer, $1 \leq k \leq (N1-4)$.

The input terminal INPUT of the shift register unit at an nth stage is connected with the first output terminal of the shift register unit at a (n−3)th stage, wherein n is an integer, $4 \leq n \leq N1$.

The input terminals INPUT of the shift register units at a first stage, a second stage and a third stage are configured to receive a trigger signal, and the reset terminals RST of the shift register units at last three stages are configured to receive a common reset signal.

In the embodiments of the present disclosure, for example, when each circuit is implemented by N-type transistors, the term "pull-up" means charging a node or an electrode of a transistor so as to increase the absolute value of the level of the node or the electrode, thereby realizing the operation (e.g., turning-on) of the corresponding transistor; the term "pull-down" refers to discharging a node or an electrode of a transistor so as to decrease the absolute value of the level of the node or the electrode, thereby realizing the operation (e.g., turning-off) of the corresponding transistor.

For another example, when each circuit is implemented as P-type transistors, the term "pull-up" means discharging a node or an electrode of a transistor so as to decrease the absolute value of the level of the node or the electrode, thereby realizing the operation (e.g., turning-on) of the corresponding transistor; the term "pull-down" means charging a node or an electrode of a transistor so as to increase the absolute value of the level of the node or the electrode, thereby realizing the operation (e.g., turning-off) of the corresponding transistor.

In addition, the specific meanings of the terms "pull-up" and "pull-down" will also be adjusted according to the specific type of the transistor used, as long as the control of the transistor may be realized and the corresponding switching function may be achieved. As mentioned above, the shift register units in the related art usually include many elements, resulting in a great area occupied by the gate driver on array in the display device.

It should be understood that the pull-up node PU, the pull-down node and the pull-down control node are examples of a first node, a second node, and a third node, respectively. In addition, the working principle of the gate driver circuit shown in FIG. 10C is similar to that of the gate driver circuit shown in FIG. 10A, and will not repeated herein.

It should be noted that the shift register unit in the gate driver circuit according to the embodiments of the present disclosure may be of various types, and is not limited to the shift register unit in the gate driver circuit shown in FIGS. 7A, 7B and 10A. For example, the shift register unit shown in FIGS. 5C and 6B may also be used, and the embodiments of the present disclosure have no limitation in this aspect. For example, when the gate driver circuit adopts the shift register unit shown in FIGS. 5C and 6B, the shift register unit has only one first clock signal terminal which is connected with the corresponding clock signal line according to the cascading order of the shift register units.

It should be noted that when the gate driver circuit 10 according to the embodiments of the present disclosure drives a display panel, the gate driver circuit 10 may be arranged at one side of the display panel. For example, the display panel includes a plurality of rows of gate lines, and the second output terminal of the level conversion circuit at each stage in the gate driver circuit 10 may be configured to be sequentially connected with the plural rows of gate lines in one-to-one correspondence, for outputting the gate scan signal to the plural rows of gate lines. It should be noted that the gate driver circuit 10 may also be arranged at two sides of the display panel respectively, to implement double-side driving, and the arrangement of the gate driver circuit 10 is not limited in the embodiments of the present disclosure.

Figure 11:
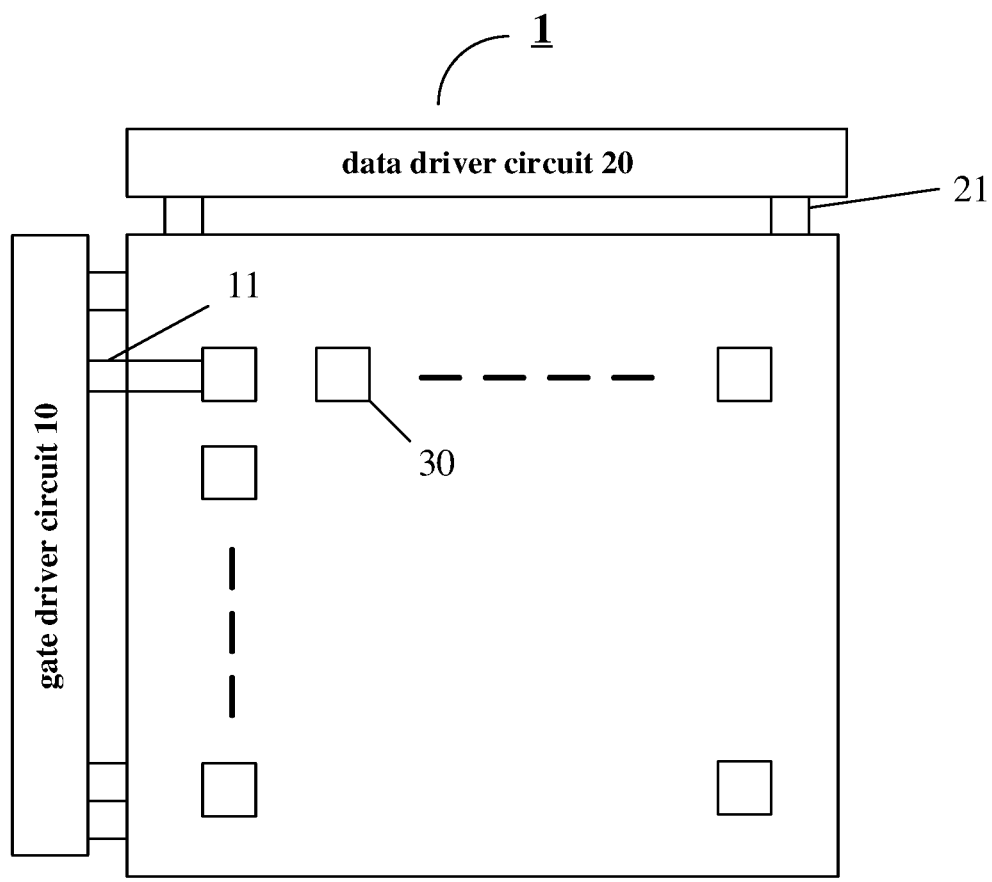
FIG. 11 is a schematic diagram of a display device according to an embodiment of the present disclosure.

The embodiments of the present disclosure further provide a display device 1, which, as shown in FIG. 11, includes the gate driver circuit 10 according to the embodiments of the present disclosure. The display device 1 includes a pixel array comprising a plurality of pixel units 30. For example, the display device 1 may further include a data driver circuit 20. The data driver circuit 20 is configured to provide a data signal for the pixel array; the gate driver circuit 10 is configured to provide a gate scan signal for the pixel array. The data driver circuit 20 is electrically connected with the pixel unit 30 by the data lines 21, and the gate driver circuit 10 is electrically connected with the pixel unit 30 by the gate lines 11.

It should be noted that the display device 1 in the present example may be any product or component with a display function, such as a liquid crystal panel, a liquid crystal TV, a display, an OLED panel, an OLED TV, an electronic paper display device, a mobile phone, a tablet PC, a notebook computer, a digital photo frame, a navigator, or the like. The display device 1 may further include other conventional components such as a display panel, which is not limited in the embodiment of the present disclosure.

The technical effects of the display device 1 according to the embodiment of the present disclosure may refer to the corresponding description about the gate driver circuit 10 in the above-mentioned embodiments, and are not repeated herein.

It should be noted that for the sake of clarity and conciseness, the entire structure of the display device 1 is not given. In order to implement necessary functions of the display device, persons skilled in the art may arrange other structures not shown herein according to a specific application scenario, and the embodiments of the present disclosure have no limitation in this aspect.

An embodiment of the present disclosure further provides a driving method, which may be used for driving the gate driver circuit shown in FIG. 1B. The driving method may include the following operations:

outputting the first voltage to the second output terminal of the level conversion circuit under the control of the corresponding first pulse scan signal received by the first control terminal; outputting the second voltage to the second output terminal of the level conversion circuit under the control of the corresponding second sub-control signal received by the second control terminal, so as to obtain the corresponding second pulse scan signal.

For example, the operation of outputting the first voltage to the second output terminal of the level conversion circuit under the control of the corresponding first pulse scan signal received by the first control terminal may include: outputting the first voltage to the second output terminal of the level conversion circuit in a case where the corresponding first pulse scan signal received by the first control terminal is at the first level.

Further, for the example shown in FIG. 7A, the gate driver circuit 10 includes two clock signal lines. By taking the level conversion circuit at the mth stage as an example, the driving method may include the following operations in sequence:

during the first period, the first output terminal of the shift register unit at the mth stage outputs the first pulse scan signal to the first control terminal of the level conversion circuit at the mth stage, and the first output terminal of the shift register unit at the mth stage outputs the first pulse scan signal at the first level, the second output terminal of the level conversion circuit at the mth stage outputs the first voltage, as the first level of the second pulse scan signal output from the level conversion circuit at the mth stage, during the second period, the first output terminal of the shift register unit at the (m+1)th stage outputs the first pulse scan signal to the first control terminal of the level conversion circuit at the (m+1)th stage, and the first output terminal of the shift register unit at the (m+1)th stage outputs the first pulse scan signal at the first level, the second output terminal of the level conversion circuit at the (m+1)th stage outputs the first voltage as the first level of the second pulse scan signal output from the level conversion circuit at the (m+1)th stage; the first output terminal of the shift register unit at the mth stage outputs the first pulse scan signal to the first control terminal of the level conversion circuit at the mth stage, and the first output terminal of the shift register unit at the mth stage outputs the first pulse scan signal at the second level, the first output terminal of the shift register unit at the (m+1)th stage outputs the first pulse scan signal to the second control terminal of the level conversion circuit at the mth stage, the second output terminal of the level conversion circuit at the mth stage outputs the second voltage as the second level of the second pulse scan signal output from the level conversion circuit at the mth stage, until the first pulse scan signal received by the first control terminal of the level conversion circuit at the mth stage is at the first level.

Further, for the example shown in FIG. 10A, the gate driver circuit 10 includes six clock signal lines. The driving method may include the following operations in sequence:

during the first period, the first output terminal of the shift register unit at the mth stage outputs the first pulse scan signal to the first control terminal of the level conversion circuit at the mth stage, and the first output terminal of the shift register unit at the mth stage outputs the first pulse scan signal at the first level, the second output terminal of the level conversion circuit at the mth stage outputs the first voltage, as the first level of the second pulse scan signal output from the level conversion circuit at the mth stage;

during the second period, the first output terminal of the shift register unit at the (m+1)th stage outputs the first pulse scan signal to the first control terminal of the level conversion circuit at the (m+1)th stage, and the first output terminal of the shift register unit at the (m+1)th stage outputs the first pulse scan signal at the first level, the second output terminal of the level conversion circuit at the (m+1)th stage outputs the first voltage as the first level of the second pulse scan signal output from the level conversion circuit at the (m+1)th stage;

during the third period, the first output terminal of the shift register unit at the (m+2)th stage outputs the first pulse scan signal to the first control terminal of the level conversion circuit at the (m+2)th stage, and the first output terminal of the shift register unit at the (m+2)th stage outputs the first pulse scan signal at the first level, the second output terminal of the shift register unit at the (m+2)th stage outputs the first voltage as the first level of the second pulse scan signal output from the level conversion circuit at the (m+2)th stage;

during the fourth period, the first output terminal of the shift register unit at the (m+3)th stage outputs the first pulse scan signal to the first control terminal of the level conversion circuit at the (m+3)th stage, and the first output terminal of the shift register unit at the (m+3)th stage outputs the first pulse scan signal at the first level, the second output terminal of the level conversion circuit at the (m+3)th stage outputs the first voltage as the first level of the second pulse scan signal output from the level conversion circuit at the (m+3)th stage; the first output terminal of the shift register unit at the mth stage outputs the first pulse scan signal to the first control terminal of the level conversion circuit at the mth stage, and the first output terminal of the shift register unit at the mth stage outputs the first pulse scan signal at the second level, the first output terminal of the shift register unit at the (m+3)th stage outputs the first pulse scan signal to the second control terminal of the level conversion circuit at the mth stage, the second output terminal of the level conversion circuit at the mth stage outputs and keeps the second voltage as the second level of the second pulse scan signal output from the level conversion circuit at the mth stage, until the first pulse scan signal received by the first control terminal of the level conversion circuit at the mth stage is at the first level;

during the fifth period, the first output terminal of the shift register unit at the (m+4)th stage outputs the first pulse scan signal to the first control terminal of the level conversion circuit at the (m+4)th stage, and the first output terminal of the shift register unit at the (m+4)th stage outputs the first pulse scan signal at the first level, the second output terminal of the level conversion circuit at the (m+4)th stage outputs the first voltage as the first level of the second pulse scan signal output from the level conversion circuit at the (m+4)th stage; the first output terminal of the shift register unit at the (m+1)th stage outputs the first pulse scan signal to the first control terminal of the level conversion circuit at the (m+1)th stage, and the first output terminal of the shift register unit at the (m+1)th stage outputs the first pulse scan signal at the second level, the first output terminal of the shift register unit at the (m+4)th stage outputs the first pulse scan signal to the second control terminal of the level conversion circuit at the (m+1)th stage, the second output terminal of the level conversion circuit at the (m+1)th stage outputs and keeps the second voltage as the second level of the second pulse scan signal output from the level conversion circuit at the (m+1)th stage, until the first pulse scan signal received by the first control terminal of the level conversion circuit at the (m+1)th stage is at the first level; and during the sixth period, the first output terminal of the shift register unit at the (m+5)th stage outputs the first pulse scan signal to the first control terminal of the level conversion circuit at the (m+5)th stage, and the first output terminal of the shift register unit at the (m+5)th stage outputs the first pulse scan signal at the first level, the second output terminal of the level conversion circuit at the (m+5)th stage outputs the first voltage as the first level of the second pulse scan signal output from the level conversion circuit at the (m+5)th stage; the first output terminal of the shift register unit at the (m+2)th stage outputs the first pulse scan signal to the first control terminal of the level conversion circuit at the (m+2)th stage, and the first output terminal of the shift register unit at the (m+2)th stage outputs the first pulse scan signal at the second level, the first output terminal of the shift register unit at the (m+5)th stage outputs the first pulse scan signal to the second control terminal of the level conversion circuit at the (m+2)th stage, the second output terminal of the level conversion circuit at the (m+2)th stage outputs and keeps the second voltage as the second level of the second pulse scan signal output from the level conversion circuit at the (m+2)th stage, until the first pulse scan signal received by the first control terminal Ctr1 of the level conversion circuit at the (m+2)th stage is at the first level.

An embodiment of the present disclosure further provides a driving method, for driving the gate driver circuit shown in FIG. 1C. The driving method may include the following operations:

outputting the first voltage to the second output terminal in a case where the corresponding first pulse scan signal received by the first control terminal is at the first level; and outputting the second voltage to the second output terminal in a case where the corresponding first pulse scan signal received by the first control terminal is at the second level, so as to obtain the corresponding second pulse scan signal.

Further, for the example shown in FIG. 7A, the gate driver circuit 10 includes two clock signal lines. By taking the level conversion circuit at the mth stage as an example, the driving method may include the following operations in sequence:

during the first period, the first output terminal of the shift register unit at the mth stage outputs the first pulse scan signal to the first control terminal of the level conversion circuit at the mth stage, and the first output terminal of the shift register unit at the mth stage outputs the first pulse scan signal at the first level, the second output terminal of the level conversion circuit at the mth stage outputs the first voltage as the first level of the second pulse scan signal output from the level conversion circuit at the mth stage; and during the second period, the first output terminal of the shift register unit at the (m+1)th stage outputs the first pulse scan signal to the first control terminal of the level conversion circuit at the (m+1)th stage, and the first output terminal of the shift register unit at the (m+1)th stage outputs the first pulse scan signal at the first level, the second output terminal of the level conversion circuit at the (m+1)th stage outputs the first voltage as the first level of the second pulse scan signal output from the level conversion circuit at the (m+1)th stage; the first output terminal of the shift register unit at the mth stage outputs the first pulse scan signal to the first control terminal of the level conversion circuit at the mth stage, and the first output terminal of the shift register unit at the mth stage outputs the first pulse scan signal at the second level, the second output terminal of the level conversion circuit at the mth stage outputs the second voltage as the second level of the second pulse scan signal output from the level conversion circuit at the mth stage, until the first pulse scan signal received by the first control terminal of the level conversion circuit at the mth stage is at the first level.

Further, for the example shown in FIG. 10A, the gate driver circuit 10 includes six clock signal lines. The driving method may include the following operations in sequence:

during the first period, the first output terminal of the shift register unit at the mth stage outputs the first pulse scan signal to the first control terminal of the level conversion circuit at the mth stage, and the first output terminal of the shift register unit at the mth stage outputs the first pulse scan signal at the first level, the second output terminal of the level conversion circuit at the mth stage outputs the first voltage as the first level of the second pulse scan signal output from the level conversion circuit at the mth stage;

during the second period, the first output terminal of the shift register unit at the (m+1)th stage outputs the first pulse scan signal to the first control terminal of the level conversion circuit at the (m+1)th stage, and the first output terminal of the shift register unit at the (m+1)th stage outputs the first pulse scan signal at the first level, the second output terminal of the level conversion circuit at the (m+1)th stage outputs the first voltage as the first level of the second pulse scan signal output from the level conversion circuit at the (m+1)th stage;

during the third period, the first output terminal of the shift register unit at the (m+2)th stage outputs the first pulse scan signal to the first control terminal of the level conversion circuit at the (m+2)th stage, and the first output terminal of the shift register unit at the (m+2)th stage outputs the first pulse scan signal at the first level, the second output terminal of the shift register unit at the (m+2)th stage outputs the first voltage as the first level of the second pulse scan signal output from the level conversion circuit at the (m+2)th stage;

during the fourth period, the first output terminal of the shift register unit at the (m+3)th stage outputs the first pulse scan signal to the first control terminal of the level conversion circuit at the (m+3)th stage, and the first output terminal of the shift register unit at the (m+3)th stage outputs the first pulse scan signal at the first level, the second output terminal of the level conversion circuit at the (m+3)th stage outputs the first voltage as the first level of the second pulse scan signal output from the level conversion circuit at the (m+3)th stage; the first output terminal of the shift register unit at the mth stage outputs the first pulse scan signal to the first control terminal of the level conversion circuit at the mth stage, and the first output terminal of the shift register unit at the mth stage outputs the first pulse scan signal at the second level, the second output terminal of the level conversion circuit at the mth stage outputs and keeps the second voltage as the second level of the second pulse scan signal output from the level conversion circuit at the mth stage, until the first pulse scan signal received by the first control terminal of the level conversion circuit at the mth stage is at the first level;

during the fifth period, the first output terminal of the shift register unit at the (m+4)th stage outputs the first pulse scan signal to the first control terminal of the level conversion circuit at the (m+4)th stage, and the first output terminal of the shift register unit at the (m+4)th stage outputs the first pulse scan signal at the first level, the second output terminal of the level conversion circuit at the (m+4)th stage outputs the first voltage as the first level of the second pulse scan signal output from the level conversion circuit at the (m+4)th stage; the first output terminal of the shift register unit at the (m+1)th stage outputs the first pulse scan signal to the first control terminal of the level conversion circuit at the (m+1)th stage, and the first output terminal of the shift register unit at the (m+1)th stage outputs the first pulse scan signal at the second level, the second output terminal of the level conversion circuit at the (m+1)th stage outputs and keeps the second voltage as the second level of the second pulse scan signal output from the level conversion circuit at the (m+1)th stage, until the first pulse scan signal received by the first control terminal of the level conversion circuit at the (m+1)th stage is at the first level; and during the sixth period, the first output terminal of the shift register unit at the (m+5)th stage outputs the first pulse scan signal to the first control terminal of the level conversion circuit at the (m+5)th stage, and the first output terminal of the shift register unit at the (m+5)th stage outputs the first pulse scan signal at the first level, the second output terminal of the level conversion circuit at the (m+5)th stage outputs the first voltage as the first level of the second pulse scan signal output from the level conversion circuit at the (m+5)th stage; the first output terminal of the shift register unit at the (m+2)th stage outputs the first pulse scan signal to the first control terminal of the level conversion circuit at the (m+2)th stage, and the first output terminal of the shift register unit at the (m+2)th stage outputs the first pulse scan signal at the second level, the second output terminal of the level conversion circuit at the (m+2)th stage outputs and keeps the second voltage as the second level of the second pulse scan signal output from the level conversion circuit at the (m+2)th stage, until the first pulse scan signal received by the first control terminal Ctr1 of the level conversion circuit at the (m+2)th stage is at the first level.

The technical effects of the gate driver circuit 10 according to the embodiments of the present disclosure may refer to the corresponding description about the gate driver circuit 10 in the above-mentioned embodiments, and are not repeated herein.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A gate driver circuit, comprising:
a scan signal generation circuit, wherein the scan signal generation circuit comprises N1 stages of first output terminals, and the scan signal generation circuit is configured to output N1 first pulse scan signals stage by stage respectively through the N1 stages of first output terminals; and
N2 level conversion circuits, wherein the N2 level conversion circuits are configured to output, under a control of a plurality of conversion control signals, N1 second pulse scan signals which are in a one-to-one correspondence with the N1 first pulse scan signals, and the plurality of conversion control signals comprise a plurality of first sub-control signals which are the N1 first pulse scan signals,
wherein N1 is an integer greater than or equal to 2, and N2 is an integer greater than or equal to 2,
wherein the scan signal generation circuit comprises N1 cascaded shift register units which are in a one-to-one correspondence with the N1 stages of first output terminals, the N1 cascaded shift register units are configured to output the N1 first pulse scan signals stage by stage respectively through the N1 stages of the first output terminals to the N2 level conversion circuits,
wherein N1 is equal to N2, and the N2 level conversion circuits are arranged in a one-to-one correspondence with the N1 stages of first output terminals, and the N2 level conversion circuits are configured to output the N1 second pulse scan signals respectively,
wherein each of the N2 level conversion circuits comprises a first control terminal, a second control terminal, and a second output terminal, the plurality of conversion control signals further comprise a plurality of second sub-control signals, and
each of the N2 level conversion circuits is configured to output one of the N1 second pulse scan signals through the second output terminal under a control of a corresponding first pulse scan signal of the N1 first pulse scan signals received at the first control terminal and a corresponding second sub-control signal of the plurality of second sub-control signals received at the second control terminal,
wherein the N2 level conversion circuits comprise a level conversion circuit at an mth stage, the N1 stages of first output terminals comprise a first output terminal at the mth stage and a first output terminal at an (m+i)th stage, the N1 first pulse scan signals comprise an mth first pulse scan signal and an (m+i)th first pulse scan signal, the first output terminal at the mth stage is configured to output the mth first pulse scan signal, and the first output terminal at the (m+i)th stage is configured to output the (m+i)th first pulse scan signal, the plurality of second sub-control signals comprise an mth second sub-control signal corresponding to the level conversion circuit at the mth stage,
a first control terminal of the level conversion circuit at the mth stage is electrically connected with the first output terminal at the mth stage to receive the mth first pulse scan signal,
a second control terminal of the level conversion circuit at the mth stage is electrically connected with the first output terminal at the (m+i)th stage to receive the (m+i)th first pulse scan signal, as the mth second sub-control signal, and
a pulse of the mth first pulse scan signal and a pulse of the (m+i)th first pulse scan signal are consecutive in time,
wherein i is an integer greater than or equal to 1, and m is an integer and $1 \leq m \leq N1$.

2. The gate driver circuit according to claim 1, wherein each of the N2 level conversion circuits comprises a first conversion subcircuit and a second conversion sub circuit,
the first conversion subcircuit is connected to the first control terminal, and the first conversion subcircuit is configured to be switched on to output a first voltage to the second output terminal in a case where the corresponding first pulse scan signal received at the first control terminal is at a first level, and
the second conversion subcircuit is connected to the second control terminal, and the first conversion subcircuit is configured to be switched on to output a second voltage to the second output terminal under a control of the corresponding second sub-control signal received at the second control terminal, so as to obtain a corresponding second pulse scan signal.

3. The gate driver circuit according to claim 2, wherein the first conversion subcircuit comprises a first transistor, a gate of the first transistor is configured to be connected with the first control terminal to receive the corresponding first pulse scan signal, a first electrode of the first transistor is configured to be connected with a first voltage terminal to receive the first voltage, and a second electrode of the first transistor is configured to be connected with the second output terminal, and the second conversion subcircuit comprises a second transistor, a gate of the second transistor is configured to be connected with the second control terminal to receive the corresponding second sub-control signal, a first electrode of the second transistor is configured to be connected with a second voltage terminal to receive the second voltage, and a second electrode of the second transistor is configured to be connected with the second output terminal.

4. The gate driver circuit according to claim 2, wherein each of the N2 level conversion circuits further comprises a voltage holding subcircuit, the voltage holding subcircuit is configured to control a voltage of the second output terminal at the first voltage in a case where the second output terminal outputs the first voltage, and to control the voltage of the second output terminal at the second voltage in a case where the second output terminal outputs the second voltage.

5. The gate driver circuit according to claim 4, wherein the voltage holding subcircuit comprises a first storage capacitor, a first electrode of the first storage capacitor is configured to be connected with the second output terminal, and a second electrode of the first storage capacitor is configured to be connected with a third voltage terminal to receive a third voltage.

6. The gate driver circuit according to claim 1, wherein each of the N1 cascaded shift register units is a GOA shift register unit, and a jth first pulse scan signal of the N1 first pulse scan signals corresponds to a jth second pulse scan signal of the N1 second pulse scan signals, and a pulse amplitude of the jth first pulse scan signal is different from a pulse amplitude of the jth second pulse scan signal, wherein j is an integer and 1≤j≤N1.

7. A display device, comprising the gate driver circuit according to claim 1.

8. A method of driving the gate driver circuit according to claim 1, comprising:

outputting a first voltage to the second output terminal under a control of the corresponding first pulse scan signal received by the first control terminal; and outputting a second voltage to the second output terminal under a control of the corresponding second sub-control signal received by the second control terminal, so as to obtain a corresponding second pulse scan signal.

9. A gate driver circuit, comprising:

a scan signal generation circuit, comprising N1 cascaded shift register units, wherein each of the N1 cascaded shift register units comprises a first output terminal, and the N1 cascaded shift register units are configured to output N1 first pulse scan signals stage by stage respectively through the first output terminals; and N2 level conversion circuits, configured to output, under a control of the N1 first pulse scan signals, N1 second pulse scan signals which are in one-to-one correspondence with the N1 first pulse scan signals, wherein N1 is an integer greater than or equal to 2, and N2 is equal to N1, each of the N2 level conversion circuits comprises a first control terminal, a second control terminal, a second output terminal, a first transistor, a second transistor, and a first storage capacitor, the first transistor is configured to be switched on to output a first voltage to the second output terminal in a case where a received corresponding first pulse scan signal is at a first level, wherein a gate of the first transistor is configured to be connected with the first control terminal to receive the corresponding first pulse scan signal, a first electrode of the first transistor is configured to be connected with a first voltage terminal to receive the first voltage, and a second electrode of the first transistor is configured to be connected with the second output terminal, the second transistor is configured to be switched on to output a second voltage to the second output terminal under a control of a received corresponding second sub-control signal, wherein a gate of the second transistor is configured to be connected with the second control terminal to receive the corresponding first pulse scan signal, a first electrode of the second transistor is configured to be connected with a second voltage terminal to receive the second voltage, and a second electrode of the second transistor is configured to be connected with the second output terminal, the first storage capacitor is configured to control a voltage of the second output terminal at the first voltage in a case where the second output terminal outputs the first voltage, and to control the voltage of the second output terminal at the second voltage in a case where the second output terminal outputs the second voltage, wherein a first electrode of the first storage capacitor is configured to be connected with the second output terminal, a second electrode of the first storage capacitor is configured to be connected with a third voltage terminal to receive a third voltage, each of the N1 cascaded shift register units further comprises an input terminal, a first clock signal terminal, a second clock signal terminal, a reset terminal, an input circuit, a first node reset circuit, an output circuit, a second node control circuit, a third node control circuit, a first node noise reduction circuit, and an output noise reduction circuit, the input circuit is configured to electrically connect a first node with the input terminal under a control of an input signal input at the input terminal to change a level of the first node, and the input circuit comprises a third transistor, wherein a gate of the third transistor is configured to be electrically connected with a first electrode of the third transistor and be connected with the input terminal to receive the input signal, and a second electrode of the third transistor is configured to be connected with the first node, the first node reset circuit is configured to electrically connect the first node and the second voltage terminal under a control of a reset signal input at the reset terminal to reset the first node, and the first node reset circuit comprises a fourth transistor, wherein a gate of the fourth transistor is configured to be connected with the reset terminal to receive the reset signal, a first electrode of the fourth transistor is configured to be connected with the first node, and a second electrode of the fourth transistor is configured to be connected with the second voltage terminal to receive the second voltage, the output circuit is configured to be switched on under the control of a level of the first node to electrically connect the first clock signal terminal and the first output terminal and output a first clock signal input at the first clock signal terminal to the first output terminal, and the output circuit comprises a fifth transistor and a second storage capacitor, wherein a gate of the fifth transistor is configured to be connected with the first node, a first electrode of the fifth transistor is configured to be connected with the first clock signal terminal to receive the first clock signal, a second electrode of the fifth transistor is configured to be connected with the first output terminal, a first electrode of the second storage capacitor is configured to be connected with the gate of the fifth transistor, and a second electrode of the second storage capacitor is connected with the second electrode of the fifth transistor, the second node control circuit is configured to electrically connect a second node and one of the second clock signal terminal and the second voltage terminal under a control of levels of the first node and a third node to change a level of the second node, and the second node control circuit comprises a sixth transistor and a seventh transistor, wherein a gate of the sixth transistor is configured to be connected with the third node, a first electrode of the sixth transistor is configured to be connected with the second clock signal terminal to receive a second clock signal, a second electrode of the sixth transistor is configured to be connected with the second node, a gate of the seventh transistor is configured to be connected with the first node, a first electrode of the seventh transistor is configured to be connected with the second node, and a second electrode of the seventh transistor is configured to be connected with the second voltage terminal to receive the second voltage, the third node control circuit is configured to electrically connect the third node and the second voltage terminal under a control of the level of the first node to change a level of the third node, and the third node control circuit comprises an eighth transistor and a ninth transistor, wherein a gate of the eighth transistor is configured to be electrically connected with a first electrode of the eighth transistor, the gate and the first electrode of the eighth transistor are configured to be connected with the second clock signal terminal to receive the second clock signal, a second electrode of the eighth transistor is configured to be connected with the third node, a gate of the ninth transistor is configured to be connected with the first node, a first electrode of the ninth transistor is configured to be connected with the third node, and a second electrode of the ninth transistor is configured to be connected with the second voltage terminal to receive the second voltage, the first node noise reduction circuit is configured to electrically connect the first node and the second voltage terminal under a control of the level of the second node to reduce noise at the first node, and the first node noise reduction circuit comprises a tenth transistor, wherein a gate of the tenth transistor is configured to be connected with the second node, a first electrode of the tenth transistor is configured to be connected with the first node, and a second electrode of the tenth transistor is configured to be connected with the second voltage terminal to receive the second voltage, the output noise reduction circuit is configured to electrically connect the first output terminal and the second voltage terminal under a control of the level of the second node to reduce noise at the first output terminal, and the output noise reduction circuit comprises an eleventh transistor, wherein a gate of the eleventh transistor is configured to be connected with the second node, a first electrode of the eleventh transistor is configured to be connected with the first output terminal, and a second electrode of the eleventh transistor is configured to be connected with the second voltage terminal to receive the second voltage, the N1 cascaded shift register units comprise a shift register unit at a mth stage and a shift register unit at an (m+3)th stage, and the N2 level conversion circuits comprise a level conversion circuit at the mth stage, the N1 first pulse scan signals comprise an mth first pulse scan signal and an (m+3)th first pulse scan signal, the first control terminal of the level conversion circuit at the mth stage is electrically connected with the first output terminal of the shift register unit at the mth stage to receive the mth first pulse scan signal as a first sub-control signal, and the second control terminal of the level conversion circuit at the mth stage is electrically connected with the first output terminal of the shift register unit at the (m+3)th stage to receive the (m+3)th first pulse scan signal as a second sub-control signal, and m is an integer greater than or equal to 1, and m+3 is less than or equal to N1, a pulse of the mth first pulse scan signal and a pulse of the (m+3)th first pulse scan signal do not temporally overlap, the reset terminal of the shift register unit at a kth stage is connected with the first output terminal of the shift register unit at a (k+3)th stage, wherein k is an integer, $1 \leq k \leq (N1-4)$, the input terminal of the shift register unit at an nth stage is connected with the first output terminal of the shift register unit at an (n−3)th stage, wherein n is an integer, $4 \leq n \leq N1$, the input terminals of the shift register units at a first stage, a second stage, and a third stage are configured to receive a trigger signal, and the reset terminals of the shift register units at a last three stages are configured to receive a common reset signal.

* * * * *